(12) United States Patent
Kwan

(10) Patent No.: US 9,891,534 B2
(45) Date of Patent: Feb. 13, 2018

(54) OPTICAL IMAGING ARRANGEMENT WITH MULTIPLE METROLOGY SUPPORT UNITS

(71) Applicant: Carl Zeiss SMT GmbH, Oberkochen (DE)

(72) Inventor: Yim-Bun Patrick Kwan, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/280,272

(22) Filed: Sep. 29, 2016

(65) Prior Publication Data

US 2017/0017164 A1    Jan. 19, 2017

Related U.S. Application Data

(63) Continuation of application No. PCT/EP2014/056853, filed on Apr. 4, 2014.

(51) Int. Cl.
| | |
|---|---|
| *G03F 7/20* | (2006.01) |
| *G02B 26/08* | (2006.01) |
| *G02B 27/00* | (2006.01) |

(52) U.S. Cl.
CPC ....... *G03F 7/7015* (2013.01); *G02B 26/0825* (2013.01); *G02B 27/0068* (2013.01); *G03F 7/70266* (2013.01); *G03F 7/70825* (2013.01)

(58) Field of Classification Search
CPC ............................ G03F 7/7015; G03F 7/7026
USPC ................................ 355/53, 67; 359/819–822
See application file for complete search history.

(56) References Cited

U.S. PATENT DOCUMENTS

| 4,492,431 | A | 1/1985 | Eitel et al. |
| 4,655,563 | A | 4/1987 | Plante |
| 5,986,795 | A | 11/1999 | Chapman et al. |
| 6,765,712 | B2 | 7/2004 | Van Dijsseldonk et al. |
| 6,842,277 | B2 | 1/2005 | Watson |
| 6,967,756 | B2 | 11/2005 | Van Dijsseldonk et al. |
| 2002/0011573 | A1 | 1/2002 | Van Dijsseldonk et al. |
| 2004/0008433 | A1 | 1/2004 | Margeson |
| 2004/0257683 | A1 | 12/2004 | Petasch et al. |
| 2005/0063076 | A1 | 3/2005 | Shimazu et al. |

(Continued)

FOREIGN PATENT DOCUMENTS

| DE | 10 2007 019 570 A1 | 10/2008 |
| EP | 1 376 192 A2 | 1/2004 |

OTHER PUBLICATIONS

International Report on Patentability for corresponding PCT Appl No. PCT/EP2014/056853, dated Oct. 4, 2016.

(Continued)

*Primary Examiner* — Hung Henry Nguyen
(74) *Attorney, Agent, or Firm* — Fish & Richardson P.C.

(57) ABSTRACT

Optical modules used in exposure processes, in particular to optical modules of microlithography systems, are disclosed. Methods for deforming an optical element of an optical module as well as to optical imaging arrangements, optical imaging of methods and a method of manufacturing an optical element, are also disclosed. The disclosed technology may be used in the context of photolithography processes for fabricating microelectronic devices, in particular semiconductor devices, or in the context of fabricating devices, such as masks or reticles, used during such photolithography processes.

23 Claims, 5 Drawing Sheets

(56) References Cited

U.S. PATENT DOCUMENTS

| | | |
|---|---|---|
| 2006/0018045 A1 | 1/2006 | Moeller et al. |
| 2006/0193065 A1 | 8/2006 | Novak |
| 2007/0258158 A1 | 11/2007 | Aoki et al. |
| 2013/0076590 A1* | 3/2013 | Baudasse ................. H01Q 3/01 343/915 |
| 2014/0125995 A1* | 5/2014 | Schoeppach ........ G03F 7/70266 356/601 |

OTHER PUBLICATIONS

International Search Report and Written Opinion for corresponding PCT Appl No. PCT/EP2014/056853, dated Mar. 24, 2015.

\* cited by examiner

OPTICAL IMAGING ARRANGEMENT WITH MULTIPLE METROLOGY SUPPORT UNITS

CROSS-REFERENCE TO RELATED APPLICATIONS

The present application is a continuation of, and claims benefit under 35 USC 120 to, international application PCT/EP2014/056853, filed Apr. 4, 2014. The entire disclosure of international application PCT/EP2014/056853 is incorporated by reference herein.

FIELD

The disclosure relates to optical modules used in exposure processes, in particular to optical modules of microlithography systems. It further relates to methods for deforming an optical element of an optical module as well as to optical imaging arrangements, optical imaging of methods and a method of manufacturing an optical element. The disclosure may be used in the context of photolithography processes for fabricating microelectronic devices, in particular semiconductor devices, or in the context of fabricating devices, such as masks or reticles, used during such photolithography processes.

BACKGROUND

Typically, the optical systems used in the context of fabricating microelectronic devices such as semiconductor devices include a plurality of optical element units including optical elements, such as lenses and mirrors etc., arranged in the light path of the optical system. Those optical elements usually cooperate in an exposure process to transfer an image of a pattern formed on a mask, reticle or the like onto a substrate such as a wafer. The optical elements are usually combined in one or more functionally distinct optical element groups. These distinct optical element groups may be held by distinct optical exposure units. In particular with mainly refractive systems, such optical exposure units are often built from a stack of optical element modules holding one or more optical elements. These optical element modules usually include an external generally ring shaped support device supporting one or more optical element holders each, in turn, holding an optical element.

Optical element groups including at least mainly refractive optical elements, such as lenses, mostly have a straight common axis of symmetry of the optical elements usually referred to as the optical axis. Moreover, the optical exposure units holding such optical element groups often have an elongated substantially tubular design due to which they are typically also referred to as lens barrels.

Due to the ongoing miniaturization of semiconductor devices it is desirable to enhance resolution of the optical systems used for fabricating those semiconductor devices. This desire for enhanced resolution obviously pushes the desire for an increased numerical aperture (NA) and increased imaging accuracy of the optical system.

One approach to achieve enhanced resolution is to reduce the wavelength of the light used in the exposure process. In the recent years, approaches have been made to use light in the extreme ultraviolet (EUV) range using wavelengths ranging from 5 nm to 20 nm, typically about 13 nm. In this EUV range it is not possible to use common refractive optics any more. This is due to the fact that, in this EUV range, the materials commonly used for refractive optical elements show a degree of absorption that is too high for obtaining high quality exposure results. Thus, in the EUV range, reflective systems including reflective elements such as mirrors or the like are used in the exposure process to transfer the image of the pattern formed on the mask onto the substrate, e.g. the wafer.

The transition to the use of high numerical aperture (e.g. NA>0.4 to 0.5) reflective systems in the EUV range leads to considerable challenges with respect to the design of the optical imaging arrangement.

Typically, in such a high numerical aperture EUV system, the feature size to be transferred to the substrate goes down to 7 nm or even below. Furthermore, if so called double patterning processes are implemented, the desired properties regarding the overlay accuracy become extremely tight, the desired accuracy going down to 1 nm or less for a single imaging apparatus. As a consequence, either the overlay error contributions of all components of the optical imaging apparatus, in particular, including the error contribution of the optical system as well as of the distortion of the substrate, have to be kept to a level below 100 pm (i.e. a sub-100 pm level) over the entire service life of the apparatus, or some wavefront or image distortion correction device operating in realtime (i.e. during exposure) has to be employed.

Various systems relating to active wavefront correction in one or more degrees of freedom (DOF) are known, for example, from U.S. Pat. No. 6,765,712, U.S. Pat. No. 6,967,756, US 2007/258158 A1, US 2006/018045 A1, DE 10 2007 019 570 A1, US 2006/0193065 A1, US 2004/0008433 A1, EP 1 376 192 A2, U.S. Pat. No. 4,655,563, U.S. Pat. No. 5,986,795, U.S. Pat. No. 4,492,431 and U.S. Pat. No. 6,842,277 B2, the entire disclosure of which is incorporated herein by reference.

These known systems may roughly be divided in two categories. The first category relates to systems where the (wavefront correcting) deformation of an optical surface is generated by deformation forces acting substantially perpendicularly to the optical surface. Such a system is known, for example, from U.S. Pat. No. 6,842,277 B2. This system, however, has the disadvantage that the deformation forces do not only deform the optical surface but also generate rigid body motions of the optical element which have to be corrected or accounted for by a suitable control loop.

The second category relates to systems where the (wavefront correcting) deformation of the optical surface is generated by bending moments introduced via deformation forces acting substantially tangentially to the optical surface. Such a system is known, for example, from US 2002/011573 A1 or U.S. Pat. No. 6,765,712. These systems may be designed in a manner avoiding parasitic rigid body motions by generating a (closed loop) force flow exclusively within the optical element, e.g. by actuators acting between two parallel levers protruding from the optical element. They nevertheless have the disadvantage that the actuators (generating the deformation forces) typically involve external energy supply via cables or the like which cause the introduction of undesired parasitic forces and/or moments into the optical element.

Furthermore, with these systems comparatively high effort is involved for removing heat introduced into the optical element via the deformation actuators without introducing such undesired parasitic forces and/or moments into the optical element (e.g. via cooling fluid ducts or the like).

A further problem that arises with the internally acting design known from US 2002/011573 A1 or U.S. Pat. No. 6,765,712 is the fact that the bending moments generated at the level of the optical surface via the two parallel levers are only equal for the planar mirror surface as disclosed. In case of a curved mirror surface, such parallel levers, due to the different length of the respective lever arm, would cause unequal bending moments at the mirror surface, which would result in (typically undesired) uneven deformation of the optical surface.

SUMMARY

The disclosure seeks, at least to some extent, to overcome the above disadvantages and to provide good and long term reliable imaging properties of an optical imaging arrangement used in an exposure process.

It is a further object of the disclosure to reduce the effort involved for an optical imaging arrangement while at least maintaining the imaging accuracy of the optical imaging arrangement used in an exposure process.

It is a further object of the disclosure to allow simple and reliable implementation of an active deformation of an optical element to at least reduce wavefront aberrations in an optical exposure process.

These and other objects are achieved according to the disclosure which, according to one aspect, is based on the technical teaching that simple and reliable correction of wavefront aberrations by active deformation of an optical element used in an optical exposure may be achieved if an optical element internal deformation concept is implemented using a three part deformation actuator concept. The deformation actuator device used in such a concept includes a first actuator part (or deformation unit) connected to a first part of the optical element, a second actuator part (or deformation unit) connected to a second part of the optical element and a third actuator part (or deformation unit) shared between the first and second actuator part to generate a first and second actuator force, respectively, exerted on the optical element to deform its optical surface.

Such a configuration has several advantages. On the one hand, via the shared third actuator part, in a rather simple manner, a configuration may be achieved where the first and second deformation force cancel out each other such that a net force on the optical element results, which is substantially zero. Hence, in a beneficial way, the deformation of the optical element doesn't generate undesired rigid body motions of the optical element.

Nevertheless, such a shared third actuator part, at the same time and in a very simple manner, allows implementing a net force exerted onto the optical element, which is unequal to zero, if desired. Hence, in a simple manner, a highly flexible actuation concept may be achieved. Eventually, in a first operating state a substantially zero net force on the optical element may be achieved, while in a second operating state a defined non-zero net force on the optical element is generated.

Furthermore, such a shared third actuator part, in a rather simple manner, allows implementing a contactless actuator solution, where no parasitic forces and/or moments are introduced into the optical element, in particular, either via the components of the energy supply to the actuator or via components of a cooling device used. This applies, in particular, if the shared actuator part is the active component to which energy has to be supplied and which eventually has to be cooled.

It should be further noted that, with such a system, a comparatively simple calibration concept of the deformation system may be achieved, such that, in particular, even an open loop deformation control may be implemented.

In particular, with such a system, one single control signal may be used for generating the first and second deformation force by simply supplying it to the shared third actuator part. In the simplest case this may be done by energizing the shared third actuator part, e.g. supplying a defined amount of energy to the shared third actuator part. The first actuator part, in cooperation with the shared third actuator part and as a result of supplying the defined amount of energy (e.g. a defined electrical current or a defined pressure etc) to the latter, then generates the first deformation force. At the same time, the second actuator part, in cooperation with the shared third actuator part and as a result of supplying the defined amount of energy (i.e. the defined electrical current or the defined pressure etc) to the latter, then generates the second deformation force. Any desired calibration may then simply ensue at the level of the interaction or interface, respectively, between the shared third actuator part and the respective first and second actuator part.

Thus, according to a first aspect, the disclosure relates to an optical module, in particular for microlithography, including an optical element and a deformation arrangement. The deformation arrangement includes at least one deformation device and is configured to introduce a definable deformation into an optical surface of the optical element. The at least one deformation device includes a first deformation unit, a second deformation unit and a third deformation unit. The first deformation unit is mechanically connected to a first part of the optical element and forms part of a first force generating unit configured to generate, as a function of a control signal, a definable first deformation force exerted on the first part of the optical element. The second deformation unit is mechanically connected to a second part of the optical element and forms part of a second force generating unit configured to generate, in particular, as a function of the control signal, a definable second deformation force exerted on the second part of the optical element. The first deformation force and the second deformation force, in at least one operating state, at least substantially cancel out each other such that a net resultant force onto the optical element is at least substantially zero. The third deformation unit is a shared force generating component shared between the first force generating unit and the second force generating unit, the first deformation unit cooperating with the third deformation unit to generate the first deformation force and the second deformation unit cooperating with the third deformation unit to generate the second deformation force.

With preferred and particularly simple embodiments of the disclosure, the third deformation unit is an active component of at least one of the first force generating unit and the second force generating unit. Preferably, at least one of the first deformation unit and the second deformation unit is a passive component, such that no energy supply to these components is involved and, hence, the introduction of parasitic forces and/or moments into the optical element may effectively be avoided.

Preferably, at least one of the first force generating unit and the second force generating unit is configured to operate in the manner of a contactless actuator, which greatly simplifies manufacture and avoiding the introduction of parasitic forces and/or moments into the optical element. In addition or as an alternative, at least one of the first force generating unit and the second force generating unit is configured to operate in the manner of a Lorentz actuator. Furthermore, in addition or as an alternative, at least one of the first force generating unit and the second force generating unit is configured to operate in the manner of a force actuator.

With simple and robust embodiments of the disclosure, at least one of the first force generating unit and the second force generating unit includes a magnet device and an electric coil device. By this approach, a simple contactless actuation principle and/or a simple force actuator principle may be implemented. Preferably, the third deformation unit includes the electric coil device, while at least one of the first deformation unit and the second deformation unit may include the magnet device.

Preferably, the electric coil device includes at least one main electric coil unit configured to cooperate with at least one magnetic unit, in particular a magnetic yoke unit, to generate at least one of the first deformation force and the second deformation force when an electric current is applied to the main electric coil unit.

With certain preferred embodiments of the disclosure, calibration and/or trimming is provided at the level of the interaction or operational interface, respectively, between the electric coil device and the magnetic unit. To this end, preferably, the electric coil device includes at least one force level trimming electric coil unit configured to cooperate with the at least one magnetic unit to adjust a force level of one of the first deformation force and the second deformation force.

With certain preferred embodiments of the disclosure, the force level trimming electric coil element is configured to substantially equalize the first deformation force and the second deformation force generated when the electric current is applied to the main electric coil unit. Such a configuration, in particular, allows realizing a simple open loop control of the deformation.

In addition or as an alternative, the electric coil device may include at least one force direction trimming electric coil unit configured to cooperate with the at least one magnetic unit to adjust a direction of one of the first deformation force and the second deformation force generated when the electric current is applied to the main electric coil unit. By this approach, in a very simple way, the net resultant force on the optical element may be adjusted and/or calibrated (e.g. to be substantially zero or to be non-zero in one or more defined operating states).

The operational interface between the electric coil device and the respective magnetic unit may basically be of any desired and suitable design for achieving the force generating functionality as outlined above.

Preferably, the at least one main electric coil unit includes a main electric coil element defining a main coil plane of main extension, the main electric coil element having a first main coil section and a second main coil section located opposite to the first main coil section within the main coil plane of main extension. The first main coil section is associated to a first magnetic unit of the first force generating unit to generate the first deformation force, while the second main coil section is associated to a second magnetic unit of the second force generating unit to generate the second deformation force. By this approach, the shared third actuator part concept may be implemented in a very simple manner.

The main electric coil element may be of any suitable and appropriate design to achieve the shared actuator part functionality as outlined above. Preferably, the main electric coil element is of generally flat design to achieve, in particular, a very compact and space-saving configuration. In addition or as an alternative, the main electric coil element may be of generally rectangular shape (yielding a very simple design).

Furthermore, in addition or as an alternative, the first main coil section and the second main coil section, to achieve collinearity of the first deformation force and the second deformation force in the at least one operating state, are substantially symmetric to a first plane of symmetry substantially perpendicular to the first deformation force, each of the first main coil section and the second main coil section further being substantially symmetric to a second plane of symmetry substantially perpendicular to the first plane of symmetry and substantially parallel to a first magnetic field of the first magnetic unit and a second magnetic field of the second magnetic unit.

Furthermore, in addition or as an alternative, at least one of the first magnetic unit and the second magnetic unit may include a generally U-shaped magnetic yoke part having two shank elements generating a magnetic field within an interstice defined between the shank elements. By this approach, a very simple design of the operational interface between the electric coil unit and the associated magnetic unit may be achieved.

Preferably, the magnetic field of the first magnetic unit and the magnetic field of the second magnetic unit are substantially parallel and/or of substantially identical field strength, the latter, in particular, providing that the first deformation force and the second deformation force may have substantially equal magnitude (ultimately leading to the mutual cancellation of the first and second deformation force in case of their collinearity).

Moreover, with preferred and simple to implement embodiments, the first magnetic unit includes two magnetic first shank elements generating a first magnetic field within a first interstice defined between the first shank elements, the first main coil section being located within the first interstice to generate the first deformation force when an electric current is applied to the main electric coil element, the first main coil section, in a direction perpendicular to the first deformation force and the first magnetic field, in particular, extending throughout the first interstice.

Similarly, in addition or as an alternative, the second magnetic unit includes two magnetic second shank elements generating a second magnetic field within a second interstice defined between the second shank elements, the second main coil section being located within the second interstice to generate the second deformation force when an electric current is applied to the main electric coil element, the second main coil section, in a direction perpendicular to the second deformation force and the second magnetic field, in particular, extending throughout the second interstice.

With certain preferred and simple to implement embodiments, the main electric coil element defines a circumferential direction, the first main coil section, in the circumferential direction, extending throughout an interstice defined between two shanks of a generally U-shaped part of the first magnetic unit. Similarly, in addition or as an alternative, the main electric coil element defines a circumferential direction, the second main coil section, in the circumferential direction, extending throughout an interstice defined between two shanks of a generally U-shaped part of the second magnetic unit.

Force level trimming of the first and/or second deformation force as outlined above may be achieved in any suitable way. Preferably, the at least one force level trimming electric coil unit includes a force level trimming electric coil element defining a force level trimming coil plane of main extension, the force level trimming coil plane of main extension, in particular, being substantially parallel to the main coil plane of main extension. The force level trimming electric coil element preferably has a force level trimming coil section spatially associated, in particular located adjacent, to the first main coil section. The first magnetic unit generates a first magnetic field in the area of the first main coil section, while the second magnetic unit generates a second magnetic field in the area of the second main coil section. The force level trimming electric coil element is configured to compensate an effect of a difference between the first magnetic field and the second magnetic field on the generation of the first deformation force and the second deformation force when the electric current is applied to the main electric coil element. By this approach, in a very simple manner, deformation force level trimming and calibration, respectively, may be achieved, in particular, despite potential differences in the magnetic properties of the two magnetic units.

It will be appreciated that the force level trimming electric coil element may be separately energized. This allows simple readjustment in case the field strength of the magnetic units degrades differently over lifetime. Preferably, however, the force level trimming electric coil element is electrically connected to the main electric coil element, such that the electric current is applied to, both, the main electric coil element and the force level trimming electric coil element. Adjustment for uneven magnetic field strength degradation of the magnetic units may then eventually be provided via other mechanism modifying the electric properties of the force level trimming electric coil element.

With certain preferred embodiments, the first magnetic unit includes two magnetic shank elements generating the first magnetic field within an interstice defined between the shank elements, the first main coil section and the force level trimming coil section being located within the first interstice to generate the first deformation force when an electric current is applied to the main electric coil element, the first main coil section and the force level trimming coil section, in a direction perpendicular to the first deformation force and the first magnetic field, in particular, extending throughout the first interstice.

It will be appreciated that calibration and adjustment, respectively, of the net resultant force on the optical element may also ensue in any desired and suitable way. With certain preferred embodiments of the disclosure, the at least one force direction trimming electric coil unit includes a force direction trimming electric coil element defining a force direction trimming coil plane of main extension, the force direction trimming coil plane of main extension being substantially parallel to the main coil plane of main extension. The force direction trimming electric coil element has a force direction trimming coil section spatially associated, in particular located adjacent, to a main coil section and a magnetic unit, the main coil section being one of the first main coil section and the second main coil section, the magnetic unit being one of the first magnetic unit main and the second magnetic unit. The magnetic unit generates a magnetic field in the area of the main coil section, and the force direction trimming electric coil element is configured to adjust a direction of the deformation force generated by the associated main coil section when the electric current is applied to the main electric coil unit.

It will be appreciated that, here as well, the force direction trimming electric coil element may be separately energized. This again allows simple adjustment in case the field strength of the magnetic units degrades differently over lifetime or in case more variable adjustment of the force direction is desired. Preferably, however, the force direction trimming electric coil element is selectively electrically connectable to the main electric coil element, such that the electric current is applied to, both, the main electric coil element and the force direction trimming electric coil element. Here as well, adjustment for uneven magnetic field strength degradation or more variable adjustment of the force direction may eventually be provided via other mechanism(s) modifying the electric properties of the force direction trimming electric coil element.

With certain preferred embodiments of the disclosure, the magnetic unit includes two magnetic shank elements generating the magnetic field within an interstice defined between the shank elements, the main coil section and the force direction trimming coil section being located within the interstice to generate the deformation force when an electric current is applied to the main electric coil element. Preferably, the force direction trimming coil section, in a trimming coil extension direction perpendicular to the first deformation force and the first magnetic field, only extends over a fraction of a dimension of the interstice in the trimming coil extension direction, the fraction, in particular being up to 95%, preferably up to 50%, more preferably 30% to 50%.

It will be appreciated that the dimensions of the force level trimming coil section and/or the force direction trimming coil section as outlined above should be as closely tuned to the desired force modification effect as possible. More precisely, waste of energy or generation of heat should be kept to a minimum by keeping the dimensions of the part of the respective trimming coil not cooperating with the associated magnetic unit as small as possible.

It will be appreciated that any desired and suitable type of deformation mechanism may be implemented for achieving the desired deformation of the optical surface. With certain preferred embodiments, in particular, allowing appropriately smooth and sufficiently sensitive deformation of the optical surface of the optical element, deformation of the optical surface is obtained via bending moments introduced into the parts of the optical element forming the optical surface.

Hence, with preferred embodiments of the disclosure, the first force generating unit is arranged such that the first deformation force exerted on the first part of the optical element, in particular, on a first lever element, introduces a first bending moment into the first part of the optical element, the first bending moment generating a definable first deformation of a first optical surface section of the optical surface. In addition or as an alternative, similarly, the second force generating unit is arranged such that the second deformation force exerted on the second part of the optical element, in particular, on a second lever element, introduces a second bending moment into the second part of the optical element, the second bending moment generating a definable second deformation of a second optical surface section of the optical surface.

Interface between the respective first and second force generating unit and the respective first and second part of the optical element may be of any desired and suitable way type. With certain preferred embodiments having a comparatively simple and robust structural design, the first force generating unit is connected to a first lever element located adjacent to a first optical surface area of the optical surface, the first lever element protruding, in a first surface normal direction from the optical element, the first surface normal direction being a first surface normal to the first optical surface area. In addition or as an alternative, similarly, the second force generating unit is connected to a second lever element located adjacent to a second optical surface area of the optical surface, the second lever element protruding, in a second surface normal direction from the optical element, the second surface normal direction being a second surface normal to the second optical surface area. By this approach, and advantageous configuration with mutually canceling bending moments at the level of the optical surface may be achieved which, in a beneficial way, leads to beneficially smooth deformation patterns at the level of the optical surface.

With preferred embodiments of the disclosure, the first lever element defines a first lever element longitudinal axis, the first lever element longitudinal axis intersecting the optical surface at a first point of intersection and forming the first surface normal at the first point of intersection. Similarly, the second lever element defines a second lever element longitudinal axis, the second lever element longitudinal axis intersecting the optical surface at a second point of intersection and forming the second surface normal at the second point of intersection.

Preferably, the first lever element longitudinal axis and the second lever element longitudinal axis define a lever element angle, the third deformation unit preferably being arranged such that the first deformation force and the second deformation force, in at least one operating state, are substantially perpendicular to a bisecting line of the lever element angle. By this approach, the above mutually canceling bending moments may be achieved in a very simple way at the level of the optical surface.

The respective first and second lever element may be designed and/or connected to the remaining part of the optical element in any suitable way. In particular, at least one of the first and second lever element may be monolithically formed with the associated part of the optical element. With other preferred embodiments, any desired type of interface may be selected between these components.

Preferably, at least one of the first lever element and the second lever element is connected to the optical element via a ball and socket type joint, the respective lever element, in particular, having a spherical end section engaging a mating spherical recess within the optical element. By this approach, a very simple and efficient way of introducing the respective bending moment from the lever element into the associated part of the optical element may be achieved. In particular, by this approach, a connection at the interface may be achieved in which the deformation load is transmitted in a manner adapted to the strength of the connection.

Preferably, at least one of the first lever element and the second lever element is connected to the optical element via an interface configured to at least partially, in particular, substantially completely, transmit a bending moment introduced into the lever element by the deformation force exerted on the lever element at least predominantly via a shear stress at the interface. This has the great advantage that the load to be transmitted over the interface is substantially evenly distributed over the entire surface of the interface, thereby greatly reducing the risk of failure of the connection (or, in other words, reducing the effort involved for obtaining a sufficiently long-term stable connection). In particular, this applies to connections where a bonding material (such as an adhesive, a solder or the like) is used for establishing the mechanical connection.

It will be appreciated that the connection between the respective lever element and the optical element may be achieved in any desired and suitable way. Preferably, at least one of the first lever element and the second lever element, in particular, being connected to the optical element using at least one of an adhesive bonding technique, a frit bonding technique, an anodic bonding technique, an optical contacting technique, a soldering technique and, in particular, a laser soldering technique.

It will be appreciated that, depending on the desired properties of the optical imaging process, basically, one single deformation device as outlined above may be sufficient to achieve the desired deformation of the optical surface. Preferably, the deformation arrangement includes a plurality of such deformation devices configured to introduce a definable deformation into the optical surface.

Basically, the deformation devices may be distributed in any suitable way over the optical element as a function of the deformation of the optical surface to be obtained during operation of the optical module. Preferably, the deformation devices are substantially evenly distributed over a deformation target area of the optical element to be deformed during operation of the optical element, since such a configuration typically allows achieving particularly beneficial deformation patterns of the optical surface.

Preferably, the deformation devices are at least section wise arranged in the manner of an array, in particular, at least section wise in the manner of a Cartesian grid array and/or at least section wise in the manner of a triangular grid array and/or at least section wise in the manner of a honeycomb grid array. Here again it will be appreciated that the arrangement preferably is selected as a function of the deformation of the optical surface to be obtained during operation.

It will be appreciated that, with certain embodiments, each deformation device may be connected to and act on a separate part of the optical element in order to obtain a desired deformation of the optical surface. Preferably, in particular to obtain higher-order deformation of the optical surface in a simple manner, each of at least two of the deformation devices, preferably at least three of the deformation devices, more preferably, four of the deformation devices, is configured to exert a definable deformation force on the first part of the optical element. This joint force exertion may ensue, in particular, sharing a component mechanically connected to the first part of the optical element for generating the definable deformation force.

It will be appreciated that the third deformation unit may be supported in any desired and suitable way. Preferably, the third deformation unit is supported in a manner mechanically and/or thermally decoupled from the optical element. While mechanical decoupling in a beneficial manner avoids the introduction of parasitic forces and/or moments into the optical element, thermal decoupling reduces the efforts involved for any temperature control of the optical element.

Preferably, the optical element is supported by a first support structure and the third deformation unit is supported by a second support structure, the first support structure being separate from the second support structure. Preferably, at least one of the first support structure and the second support structure is supported in an isostatic manner and/or a vibration isolated manner on a third support structure. By this approach, particularly simple mechanical decoupling (in particular, vibration decoupling) may be achieved. The third support structure may, for example, be a so called base frame, which, typically, itself is supported (preferably in a vibration isolated manner) on a ground structure.

With other preferred embodiments of the disclosure, the third deformation unit is supported by a first support structure, the first support structure, in particular, being supported in a vibration isolated manner on the optical element.

It will be appreciated that the components as described above may be made of any desired and suitable material for performing the function as outlined. Preferably, at least one of the optical element and a lever element connected to the optical element includes a material selected from a material group consisting of Zerodur (i.e. a lithium aluminosilicate glass-ceramic), Ultra Low Expansion glass (ULE; i.e. a glass material including silica and less than 10% titanium dioxide), Cordierite and quartz. In particular materials having a low coefficient of thermal expansion are highly preferred in this respect.

With certain embodiments of the disclosure, the optical element includes a main body element forming the optical surface, the main body element, at least section wise, being at least one of a generally thin walled plate element and a generally thin walled shell element. Furthermore, with certain embodiments of the disclosure, the optical element includes a main body element defining an outer circumference, at least one outer stabilizing element being connected to the main body element at the outer circumference. Such configurations allow simple and economic manufacture of the optical element as will be explained in greater detail below.

It will be appreciated that the optical module as outlined above may be used in the context of arbitrary optical imaging processes using arbitrary types of optical elements (such as lenses, mirrors, gratings etc). Particularly beneficial effects are achieved in the context of microlithography, in particular using exposure light in the EUV range. Hence, preferably, the optical element is a mirror, in particular, for use in a microlithography device operated, in particular, using exposure light in an EUV range.

With certain embodiments of the disclosure, the at least one outer stabilizing element is formed by a generally ring shaped element extending along the outer circumference. Furthermore, preferably, the at least one outer stabilizing element is connected to the optical element using at least one of an adhesive bonding technique, a frit bonding technique, an anodic bonding technique, an optical contacting technique, a soldering technique and, in particular, a laser soldering technique. Furthermore, preferably, the optical element is supported, in particular in an isostatic manner, at the at least one outer stabilizing element to obtain, in particular, good and long-term stable support of the optical element.

With a certain preferred embodiments of the disclosure, the optical element is supported at the at least one outer stabilizing element in a manner to be adjustable, in particular actively adjustable, in at least one degree of freedom, in particular in all six degrees of freedom.

It will be appreciated that, basically, any desired and suitable material may be used for the main body element and the outer stabilizing element, respectively. In particular, in some cases, the same material may be used for the main body element and the outer stabilizing element. Preferably, the a main body element is formed by a first material and the at least one outer stabilizing element is formed by a second material, the material having at least one material property, in particular a coefficient of thermal expansion, a grade of the material property, in a grading system defined by a field of use of the optical module, being lower in the second material than in the first material, in particular, lower by up to 1000%, preferably by up to 20%, more preferably by up to 2%, of the material property of the first material. In other words, preferably, the outer stabilizing element is made of a lower grade material (or an inferior grade material) than the main body element which, among others, yields more economic solutions. It will be appreciated that the fact of being of superior or inferior grade depends on the grading system relevant for the actual field of use. Hence, for example, in a microlithography environment, a lower coefficient of thermal expansion, typically, stands for a higher grade material. Hence, in this case, preferably, the first material for the main body element has a lower coefficient of thermal expansion (i.e. a higher grade) than the second material for the outer stabilizing element.

Preferably, the main body element is formed by a first material and the at least one outer stabilizing element is formed by a second material, the second material having a deviation in a coefficient of thermal expansion from the first material, i.e. a mismatch in the coefficient of thermal expansion. With certain embodiments of the disclosure, the deviation ranges up to 1 ppm/K, preferably up to 0.01 ppm/K, more preferably up to 0.001 ppm/K.

According to a second aspect, the disclosure relates to a method of deforming an optical element, in particular for microlithography, including providing an optical element and at least one deformation device including a first deformation unit, a second deformation unit and a third deformation unit, mechanically connecting the first deformation unit to a first part of the optical element, mechanically connecting the second deformation unit to a second part of the optical element, using the first deformation unit and the third deformation unit to exert, as a function of a control signal, a definable first deformation force on a first part of the optical element, and using the second deformation unit and the third deformation unit to exert, in particular, as a function of the control signal, a definable second deformation force on a second part of the optical element. The first deformation force and the second deformation force generate a defined deformation of the optical element, the first deformation force and the second deformation force, in at least one operating state, at least substantially cancelling out each other such that a net resultant force onto the optical element is at least substantially zero. With such a method the variants and advantages of the optical module as outlined above may be achieved to the same extent. Hence, reference is made to the explanations given above.

According to a third aspect, the disclosure relates to an optical module, in particular for microlithography, including an optical element and a deformation arrangement. The deformation arrangement includes at least one deformation device and is configured to introduce a definable deformation into an optical surface of the optical element. The at least one deformation device includes a first deformation unit, a second deformation unit and a third deformation unit. The first deformation unit is mechanically connected to a first part of the optical element and forming part of a first force generating unit configured to generate, as a function of a control signal, a definable first deformation force exerted on the first part of the optical element. The second deformation unit is mechanically connected to a second part of the optical element and forms part of a second force generating unit configured to generate, in particular, as a function of the control signal, a definable second deformation force exerted on the second part of the optical element. The third deformation unit is a shared force generating component shared between the first force generating unit and the second force generating unit, the first deformation unit cooperating with the third deformation unit in a contactless manner to generate the first deformation force and the second deformation unit cooperating with the third deformation unit in a contactless manner to generate the second deformation force.

As outlined above, with such a contactless three-part actuator concept, the introduction of parasitic forces and/or moments into the optical element may be largely avoided. Similarly, such a contactless three-part actuator concept allows realizing configurations which are beneficial under thermal and mechanical aspects. In particular, appropriate temperature adjustment and control, respectively, may be achieved in a simple manner without the risk of introducing parasitic forces and/or moments into the optical element.

According to a fourth aspect, the disclosure relates to a method of deforming an optical element, in particular for microlithography, including providing an optical element and at least one deformation device including a first deformation unit, a second deformation unit and a third deformation unit, mechanically connecting the first deformation unit to a first part of the optical element, mechanically connecting the second deformation unit to a second part of the optical element. The first deformation unit and the third deformation unit cooperate in a contactless manner to exert, as a function of a control signal, a definable first deformation force on a first part of the optical element. The second deformation unit and the third deformation unit cooperate in a contactless manner to exert, in particular, as a function of the control signal, a definable second deformation force on a second part of the optical element. The first deformation force and the second deformation force generate a defined deformation of the optical element. With such a method the variants and advantages of the optical module as outlined above may be achieved to the same extent. Hence, reference is made to the explanations given above.

According to a fifth aspect, the disclosure relates to an optical imaging arrangement including a mask unit adapted to receive a pattern, a substrate unit adapted to receive a substrate, an illumination unit adapted to illuminate the pattern, and an optical projection unit adapted to transfer, in an exposure step, an image of the pattern onto the substrate. At least one of the illumination unit and the optical projection unit includes an optical module according to the disclosure.

According to a sixth aspect, the disclosure relates to an optical imaging method including transferring, in an exposure step, an image of a pattern formed on a mask onto a substrate using at least one optical element module; wherein, in at least one deformation step, an optical element of the optical element module is deformed in a defined manner using a method according to the disclosure. Preferably, the at least one deformation step is at least partially executed prior to the exposure step and/or during the exposure step.

With such an optical imaging arrangement and/or such an optical imaging method the variants and advantages of the optical modules and methods as outlined above may be achieved to the same extent. Hence, reference is made to the explanations given above.

Preferably, the at least one deformation step is at least partially executed prior to the exposure step and/or during the exposure step. Furthermore, preferably, prior to and/or during the exposure step, the optical element is used as a central reference in an optical system including the optical element and further optical components cooperating with the optical element in transferring the image onto the substrate, the central reference being used for controlling a position and/or an orientation of at least one of the optical components, preferably of all the components, in at least one degree of freedom, preferably all six degrees of freedom.

According to a seventh aspect, the disclosure relates to a method of manufacturing an optical element, in particular for an optical element module according to the disclosure, including providing a main body element of the optical element and bonding at least one optical element component to the main body element, wherein the optical element has a first part and a second part the first part forming a first interface for a first deformation unit of a deformation device and the second part forming a second interface for a second deformation unit of the deformation device.

With preferred embodiments of the disclosure, the main body element is formed from a generally thin walled element, the thin walled element, in a coarse shaping step, being brought into a heated state and, in the heated state, being introduced into a mold to shape the thin walled element yielding a coarse geometry of the main element body. In a fine shaping step, the main body element, in particular after connecting the first deformation unit to the first interface and the second deformation unit to the second interface and/or after connecting at least one outer stabilizing element to the main body element, is worked to obtain a final shape of the main element body, in particular, to obtain a final shape of an optical surface of the main element body. Such a variant allows highly economic manufacture of the optical element. In particular, such a method allows manufacturing optical elements of fairly complex geometry, in particular, with a comparatively strongly curved optical surface, without having to remove large volumes of material from a large material blank.

With preferred embodiments of the disclosure, the first part is formed by a first lever element located adjacent to a first optical surface area of an optical surface of the main body element, the first lever element protruding, in a first surface normal direction from the optical element, the first surface normal direction being a first surface normal to the first optical surface area. In addition or as an alternative, the second part is formed by a second lever element located adjacent to a second optical surface area of the optical surface of the main body element, the second lever element protruding, in a second surface normal direction from the optical element, the second surface normal direction being a second surface normal to the second optical surface area. This allows simple and economic realization of advantageous configurations for actively deforming the optical surface as they have been outlined above. Hence, reference is made in so far to the explanations given above.

With further preferred embodiments, at least one of the first lever element and the second lever element is connected to the main body element via a ball and socket type joint, the respective lever element, in particular, having a spherical end section engaging a mating spherical recess within the main body element. In addition or as an alternative, at least one of the first lever element and the second lever element is connected to the main body element via an interface configured to at least partially, in particular, substantially completely, transmit a bending moment introduced into the lever element by a deformation force exerted on a free end of the lever element via a shear stress at the interface. Furthermore, in addition or as an alternative, at least one of the first lever element and the second lever element is connected to the main body element using at least one of an adhesive bonding technique, a frit bonding technique, an anodic bonding technique, an optical contacting technique, a soldering technique and, in particular, a laser soldering technique. The advantages of these configurations have been described above, such that reference is made to the explanations given above.

Furthermore, with certain embodiments of the disclosure, the first lever element and the second lever element are connected to the main body element using a template unit having a plurality of recesses each receiving a part of the lever element, the template unit, in particular, being supported on the optical element in an isostatic manner. By this approach, in a very simple manner, highly precise manufacture of the optical element may be achieved.

Finally, with certain embodiments of the disclosure, the main body element defines an outer circumference, at least one outer stabilizing element being connected to the main body element at the outer circumference. In particular, such a variant allows manufacturing highly stable optical elements of fairly complex geometry without having to remove large volumes of material from a large material blank. Preferably, the at least one outer stabilizing element is formed by a generally ring shaped element extending along the outer circumference thereby yielding a particularly stable design.

Connection of the outer stabilizing element to the main body element may ensue in any suitable way. Preferably, the at least one outer stabilizing element is connected to the optical element using at least one of an adhesive bonding technique, a frit bonding technique, an anodic bonding technique, an optical contacting technique, a soldering technique and, in particular, a laser soldering technique.

As already outlined above, the main body element may be formed by a first material and the at least one outer stabilizing element may be formed by a second material, the material having at least one material property, in particular a coefficient of thermal expansion, a grade of the material property, in a grading system defined by a field of use of the optical module, being lower in the second material than in the first material, in particular, lower by up to 1000%, preferably by up to 20%, more preferably by up to 2%, of the material property of the first material. As mentioned, this yields highly economic configurations.

Further aspects and embodiments of the disclosure will become apparent from the dependent claims and the following description of preferred embodiments which refers to the appended figures. All combinations of the features disclosed, whether explicitly recited in the claims or not, are within the scope of the disclosure.

DETAILED DESCRIPTION OF THE DISCLOSURE

In the following, a preferred embodiment of an optical imaging arrangement 101 according to the disclosure with which preferred embodiments of methods according to the disclosure may be executed will be described with reference to FIGS. 1 to 9. To facilitate understanding of the following explanations a xyz coordinate system is introduced in the Figures, wherein the z-direction designates the vertical direction (i.e. the direction of gravity).

Figure 1:
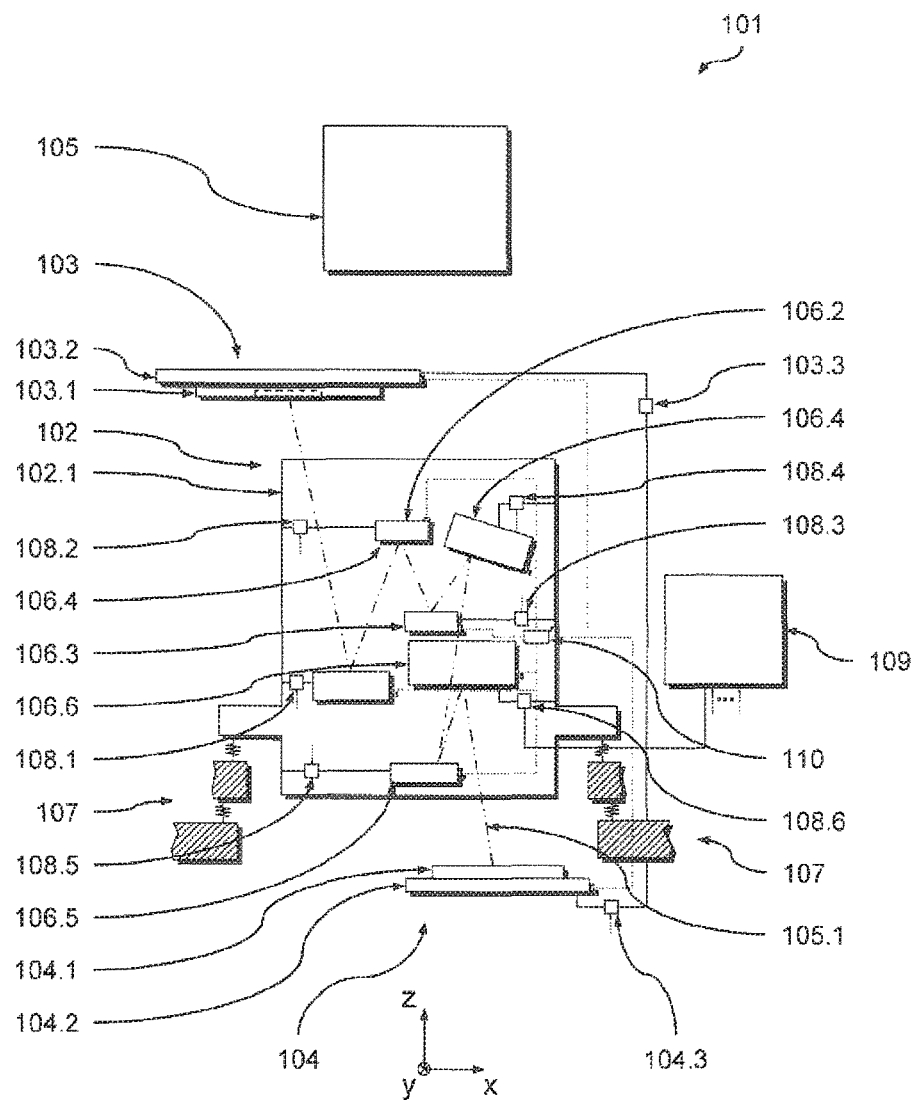
FIG. 1 is a schematic representation of a preferred embodiment of an optical imaging arrangement according to the disclosure in the context of which preferred embodiments of methods according to the disclosure may be executed.

FIG. 1 is a highly schematic and not-to-scale representation of the optical imaging arrangement in the form of an optical exposure apparatus 101 operating in the EUV range at a wavelength of 13 nm. The optical exposure apparatus 101 includes an optical projection unit 102 adapted to transfer an image of a pattern formed on a mask 103.1 (located on a mask table 103.2 of a mask unit 103) onto a substrate 104.1 (located on a substrate table 104.2 of a substrate unit 104). To this end, the optical exposure apparatus 101 includes an illumination system 105 illuminating the reflective mask 103.1 via an appropriate light guide system (not shown). The optical projection unit 102 receives the light (represented by its chief ray 105.1) reflected from the mask 103.1 and projects the image of the pattern formed on the mask 103.1 onto the substrate 104.1, e.g. a wafer or the like.

To this end, the optical projection unit 102 holds an optical element module group 106 of optical element modules 106.1 to 106.6. This optical element module group 106 is held within a support structure 102.1. The support structure 102.1 may take the form of a housing of the optical projection unit 102, which, in the following, is also referred to as the projection optics box (POB) 102.1. It will be appreciated, however, that this support structure does not necessarily have to form a complete or tight enclosure of the optical element module group 106. Rather it may also be partially formed as an open structure.

The projection optics box 102.1 is supported in a vibration isolated manner on a base structure 107 which also supports the mask table 103.2 via a mask table support device 103.3 and the substrate table 104.2 via a substrate table support device 104.3. It will be appreciated that the projection optics box 102.1 may be supported in a cascaded manner via a plurality of vibration isolation devices and at least one intermediate support structure unit to achieve good vibration isolation. Generally, these vibration isolation devices may have different isolation frequencies to achieve good vibration isolation over a wide frequency range.

The optical element module group 106 includes a total of six optical element modules, namely a first optical element module 106.1, a second optical element module 106.2, a third optical element module 106.3, a fourth optical element module 106.4, a fifth optical element module 106.5 and sixth optical element module 106.6. In the present disclosure, each of the optical element modules 106.1 to 106.6 includes an optical element in the form of a mirror.

It will be appreciated that the respective optical element module may also include further components (beyond the optical element itself) such as, for example, aperture stops, holders or retainers holding the optical element and eventually forming an interface for the support unit connecting the optical element module to the support structure.

It will be further appreciated that, with other embodiments of the disclosure, another number of optical element modules may be used. Preferably, four to eight optical element modules are provided.

Each one of the optical element modules 106.1 to 106.6 is supported on the support structure formed by the projection optics box 102.1 by an associated support device 108.1 to 108.6. Each one of the support devices 108.1 to 108.6 is formed as an active device such that each of the optical element modules 106.1 to 106.6 is actively supported at a defined control bandwidth.

In the present example, the optical element module 106.6 is a large and heavy component forming a first optical element module of the optical element module group 106 while the other optical element modules 106.1 to 106.5 form a plurality of second optical element modules of the optical element module group 106. The first optical element module 106.6 is actively supported at a low first control bandwidth, while the second optical element modules 106.1 to 106.5 are actively supported at a second control bandwidth to substantially maintain a given spatial relationship of each of the second optical element modules 106.1 to 106.5 with respect to the first optical element module 106.6 as will be explained further below.

In the present example, a similar active support concept is chosen for the mask table support device 103.3 and the substrate table support device 104.3 both also actively supported at a third and fourth control bandwidth, respectively, to substantially maintain a given spatial relationship of the mask table 103.2 and the substrate table 104.2, respectively, with respect to the first optical element module 106.6. It will be appreciated however that, with other embodiments of the disclosure, another support concept may be chosen for the mask table and/or the substrate table.

As will be explained in further detail below, control of the active support devices 108.1 to 108.6, 103.3 and 104.3 is performed by a control unit 109 as a function on the signals of a metrology arrangement 110. Adjustment control of the components participating in the imaging process is performed the following way.

To achieve the active low bandwidth support the first optical element module 106.6, the first support device 108.6 of the first optical element module 106.6 is configured and controlled to provide adjustment of the first optical element module 106.6 with respect to a component of the metrology arrangement 110 at a first adjustment control bandwidth ranging from 5 Hz to 100 Hz, preferably from 40 Hz to 100 Hz.

Furthermore, to achieve the active support the second optical element modules 106.1 to 106.5, the mask table 103.2 and the substrate table 104.2, respectively, each of the second support devices 108.1 to 108.5 of the second optical element modules 106.1 to 106.5 as well as the mask table support device 103.3 and the substrate table support device 104.3, respectively, is configured and controlled to provide adjustment of the respective associated optical element module 106.1 to 106.5, the mask table 103.2 and the substrate table 104.2, respectively, at a second, third and fourth adjustment control bandwidth, respectively, ranging from 5 Hz to 400 Hz, preferably from 200 Hz to 300 Hz. It will be appreciated that, with certain embodiments of the disclosure, the second control bandwidth may vary among the second support devices 108.1 to 108.5.

The present example follows a support strategy according to which the large and heavy first optical element module 106.6 posing the most severe problems in reaching the high control bandwidth typically involved in EUV microlithography is actively supported in a controlled manner at a low bandwidth (at which control may be readily achieved for this optical element module 106.6) while the other components participating in the exposure process, i.e. the second optical element modules 106.1 to 106.5, the mask table 103.2 and the substrate table 104.2, are controlled to maintain a sufficiently stable and accurate spatial relation with respect to the first optical element module 106.6 and, hence, with respect to each other.

Hence, despite the fact that, in the present example, all components participating in the imaging process (i.e. the optical element modules 106.1 to 106.6, the mask 103.1 and the substrate 104.1) are actively controlled, the greatly relaxed properties for the adjustment control bandwidth of the first optical element module 106.6 largely outweigh the increased expense for the active support of the individual components. In particular, adjustment control of a large optical footprint component such as the mirror 107 of the optical element module 106.6 (which may have an optical footprint of up to 1.5 m×1.5 m and a mass of up to 350 kg) is greatly facilitated compared to conventional systems where, typically, an adjustment control bandwidth of 200 Hz to 300 Hz is used and considered desired (a control bandwidth that can hardly be reached for such large optical footprint components due to their low resonant frequency).

According to the support strategy of the present example one component of the optical system (typically a large and/or heavy one of these components) is used as an inertial reference to which one or more of the other components (up to all of the other components) may be referred to for measuring and, ultimately, adjustment purposes. In the present example, the large optical footprint mirror 111 of optical element module 106.6 is used as the inertial reference to which all further components 106.1 to 106.5, 103.1 and 104.1 participating in the imaging process are referred to as will be explained in further detail below. It will be appreciated however that, with other embodiments of the disclosure, depending on the optical design, any suitable component other than the optical element module hit last by the exposure light may be used as this inertial reference.

A further great advantage of this support strategy and the relaxed control bandwidth properties for the first optical element module 106.6, in particular, for its mirror 111, is the fact that mirror 111 may be designed in a structurally less rigid manner which renders it highly suitable for using it as a correcting optical element, which is actively deformed for correcting wavefront aberrations during exposure as will be explained in greater detail below.

The specific design of the support devices 108.1 to 108.6 will be briefly explained in the following with reference to FIG. 2. In the present example, all support devices 108.1 to 108.6 basically have the same components and the same functionality. It will be appreciated however that, with other embodiments of the disclosure, a different design may be chosen among the individual mirror support devices used.

Each support device 108.1 to 108.6 exclusively includes three support units 112 distributed at the outer circumference of the associated optical element module 106.1 to 106.6. Each support unit 112 exclusively includes two support actuator devices 113 arranged in the manner of a bipod as well as a centrally arranged active gravity compensation device 114. It will be appreciated however that, with other embodiments of the disclosure, any other suitable design and alignment of the components of the mirror support devices may be chosen.

Figure 2:
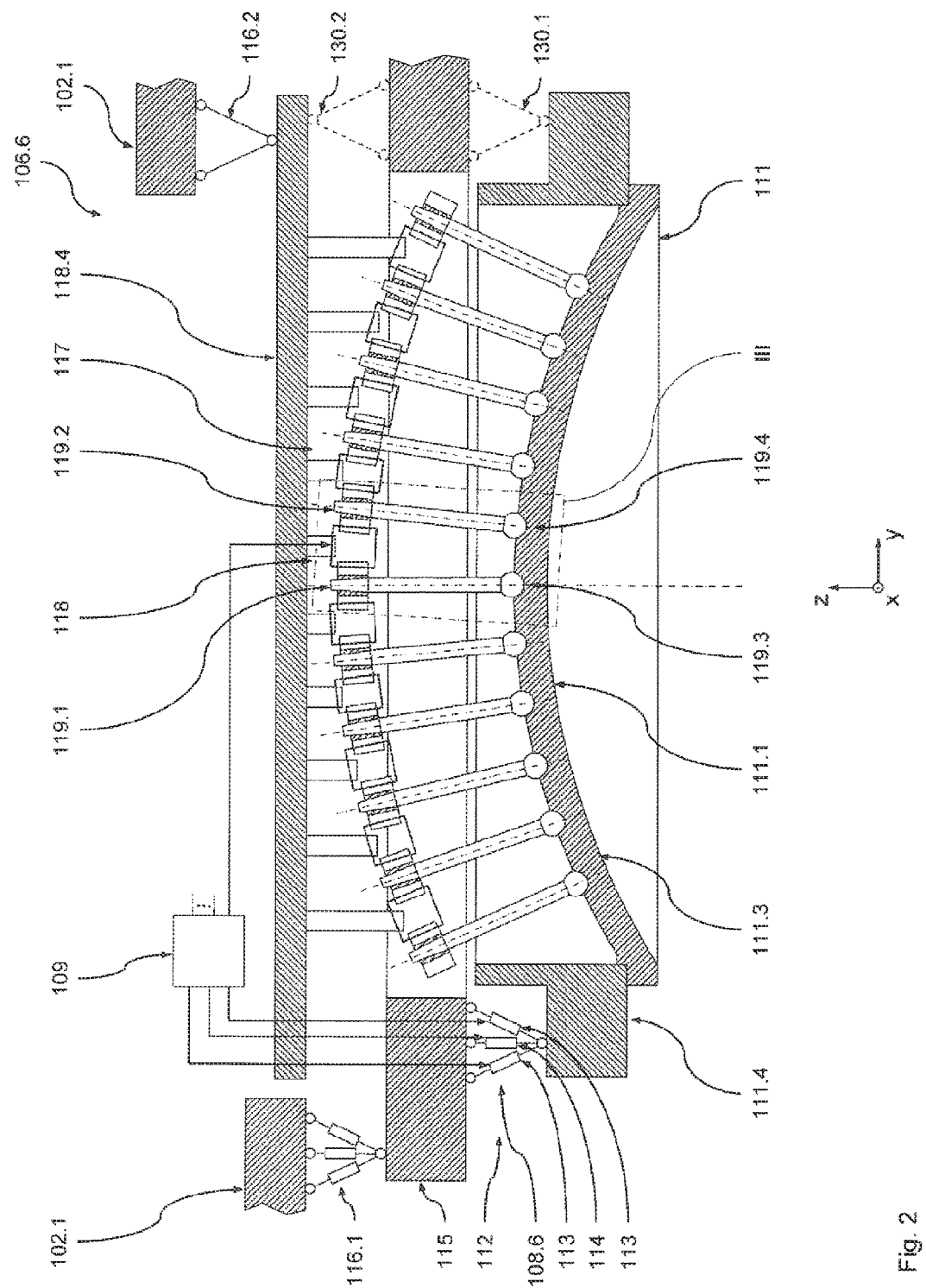
FIG. 2 is a schematic sectional representation of a part of the optical imaging arrangement of FIG. 1.

As can be seen from FIG. 2, the support actuator devices 113 as well as the associated gravity compensation device 114 at one end are connected to a holding device in the form of a holding ring 115 located at the outer circumference of optical element module 106.6. At their other end of the support actuator devices 113 as well as the gravity compensation device 114 are connected to an optical element of optical module 106.6 in the form of mirror 111. The holding ring 115 itself is connected to a structural component of the projection optics box 102.1 in an isostatic manner via a vibration isolation device 116.1. Hence, the support actuator devices 113 of all three support units 112 form a hexapod support serving to adjust the position and orientation of the associated optical element module 106.1 to 106.6 in all six degrees of freedom.

It will be appreciated that, with other embodiments of the disclosure, vibration isolation of the optical element 111 may already be achieved via the actuator devices 113 and the associated gravity compensation device 114, in particular, if these are working according to a non-contact working principle. In these cases, support 116.1 may also be a simple rigid isostatic support, preferably supporting optical element 111 on a so called sensor frame (itself supported in a vibration isolated manner on a so called base frame).

It will be further appreciated that, with other embodiments of the disclosure, adjustment of the respective optical element module 106.1 to 106.6 in space may be provided in any other desired number of degrees of freedom depending on the desired properties for the respective optical element unit. More precisely, depending on the spatial and optical boundary conditions, motion of the optical element module 106.1 to 106.6 in one or more degrees of freedom may be optically irrelevant (i.e. may have no noticeable effect on imaging accuracy) such that adjustment in the respective degree of freedom may be dispensed with (such as it may be the case, for example, for a translatory motion of a planar optical surface within its plane). Furthermore, any other desired number and/or arrangement of support actuators may be used to achieve the desired adjustment in the desired number of degrees of freedom.

The three gravity compensation devices 114 of the respective support device 108.1 to 108.6 each counteract a fraction of the gravitational force acting on the associated optical element module 106.1 to 106.6 such that, together, they serve to cumulatively compensate the gravitational force acting on the associated optical element module 106.1 to 106.6. Hence, the support actuator devices 113 only have to generate the dynamic forces involved for adjusting the associated optical element module 106.1 to 106.6 (i.e. its position and/or orientation) in space. It will be appreciated however that, with other embodiments of the disclosure, such a gravity compensation device may also be omitted.

As had been outlined above, mirror 111 is actively suspended to holding ring 115 the three support units 112, substantially evenly distributed at the outer circumference of mirror 111. It will be appreciated however that, with other embodiments of the disclosure, any other type of suitable, preferably isostatic, support of mirror 111 may be selected.

As mentioned above, in addition to the active support concept chosen for all components participating in the imaging process, as a further measure to improve imaging quality of apparatus 101, the optical module 106.6, which forms a preferred embodiment of the optical module according to the present disclosure, is adapted to correct wavefront aberrations within the exposure light by actively introducing a defined deformation into mirror 111.

To this end, the optical module 106.6, includes a deformation arrangement 117 configured to introduce a definable deformation into the optical surface 111.1 of mirror 111. More precisely, the deformation arrangement 117 includes a plurality of deformation devices 118 substantially evenly distributed in the manner of a Cartesian grid (see FIG. 4) over the rear side (i.e. the side facing away from the optical surface 111.1) of mirror 111. Each deformation device 118 is configured to generate a defined deformation of an associated part of the optical surface 111.1.

It will be appreciated that any desired number of deformation devices 118 may be implemented, in particular, as a function of the deformation of the optical surface 111.1 to be achieved. In the present example, up to 100 deformation devices 118 are distributed over the rear side of mirror 111. It will be appreciated however that, with other embodiments of the disclosure, even a higher number of deformation devices may be implemented. A number of 200 and beyond may easily be implemented, in particular, depending on the size of the optical element as well as the deformation pattern to be achieved.

In the present example, each deformation device 118 is configured to implement an optical element internal deformation concept using a three part deformation actuator concept. To this end, as can be seen in greater detail in particular from FIG. 3, each deformation device 118 includes a first deformation unit 118.1 mechanically connected to a first part of mirror 111, namely a first lever element 119.1 of mirror 111. The first deformation unit 118.1 is connected to the free end of the first lever element 119.1 which radially protrudes from the rear side of mirror 111.

Furthermore, each deformation device 118 includes a second deformation unit 118.2 mechanically connected to a second part of mirror 111, namely a second lever element 119.2 of mirror 111. The second deformation unit 118.2, again, is connected to the free end of the second lever element 119.2 which is located adjacent to the first lever element 119.1 and also radially protrudes from the rear side of mirror 111.

Finally, each deformation device 118 includes a third deformation unit 118.3 spatially and functionally associated to the first deformation unit 118.1 and the second deformation unit 118.2, as will be explained in greater detail below. Each third deformation unit is supported by a support structure 118.4. The support structure 118.4, in turn, is supported in an isostatic manner on a further structural component of the projection optics box 102.1 via a hexapod support structure including three bipods 116.2. Hence, the support structure 118.4 and, ultimately, the respective deformation device 118, is supported in a manner mechanically decoupled from mirror 111. Furthermore, by this approach, mirror 111 is also largely thermally decoupled from support structure 118.4 and, ultimately, the respective deformation device 118.

The first deformation unit 118.1 and the third deformation unit 118.3 form part of a first force generating unit 120.1 configured to generate, as a function of a control signal supplied from control unit 109 to this first force generating unit 120.1, a definable first deformation force F1 exerted on the first lever element 119.1 of the optical element. Similarly, the second deformation unit 118.2 and the third deformation unit 118.3 form part of a second force generating unit 120.2 configured to generate, as a function of a control signal supplied from control unit 109 to this second force generating unit 120.2, a definable second deformation force F2 exerted on the second lever element 119.2 of the optical element.

Hence, the third deformation unit 118.3 is a shared force generating component shared between the first force generating unit 120.1 and the second force generating unit 120.1 to generate the desired deformation of the optical surface 111.1 of mirror 111.

Figure 3:
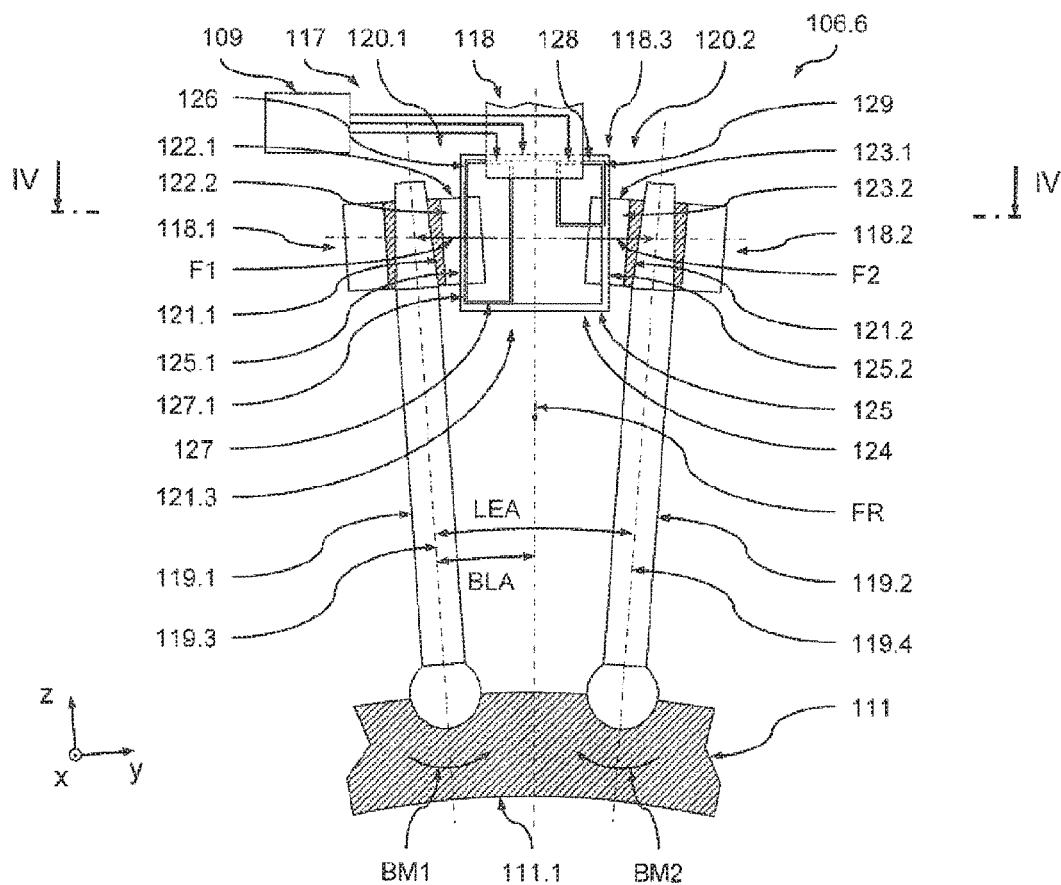
FIG. 3 is a schematic representation of detail III of the optical module of FIG. 2 (along line III-III of FIG. 4)

In a first operating state of apparatus 101 as shown in FIG. 3, the first deformation force F1 and the second deformation force F2 have the same line of action (i.e. are collinear) and have identical magnitude but have opposite directions. Consequently, the deformation forces F1 and F2 at least substantially cancel out each other, such that their net resultant force FR exerted on mirror 111 is at least substantially zero (i.e. FR=0 applies).

Hence, in a beneficial way, the deformation of mirror 111 generated by the deformation device 118 doesn't generate undesired rigid body motions of mirror 111, which would otherwise have to be corrected or compensated, respectively, via the support devices 108.6 (which otherwise would render the control scheme implemented in control device 109 more complicated). As a consequence, the desired properties regarding control device 109 are greatly relaxed.

It will be appreciated however that, as will be explained in greater detail below, in a different second operating mode of apparatus 101, using the deformation device 118, a net resultant force FR may be exerted onto the optical element, which is unequal to zero (i.e. FR≠0 applies), if desired. Such a non-zero net resultant force FR may for example be desired to balance one or more other non-zero net resultant forces FR exerted by other deformation devices 118 in order to achieve a desired deformation of mirror 111. Hence, in a simple manner, a highly flexible deformation actuation concept may be achieved.

It will be appreciated that, in certain other embodiments of the disclosure, it may even be desired to generate defined rigid body motions of the optical element using the deformation devices 118.

It will be appreciated that the mutually canceling first and second deformation force F1 and F2 applied to the lever elements 118.1 and 118.2, respectively, generate mutually canceling bending moments BM1 and BM2, respectively, at the level of the optical surface 111.1 which, in a beneficial way, lead to beneficially smooth deformation patterns at the level of the optical surface 111.1.

Figure 4:
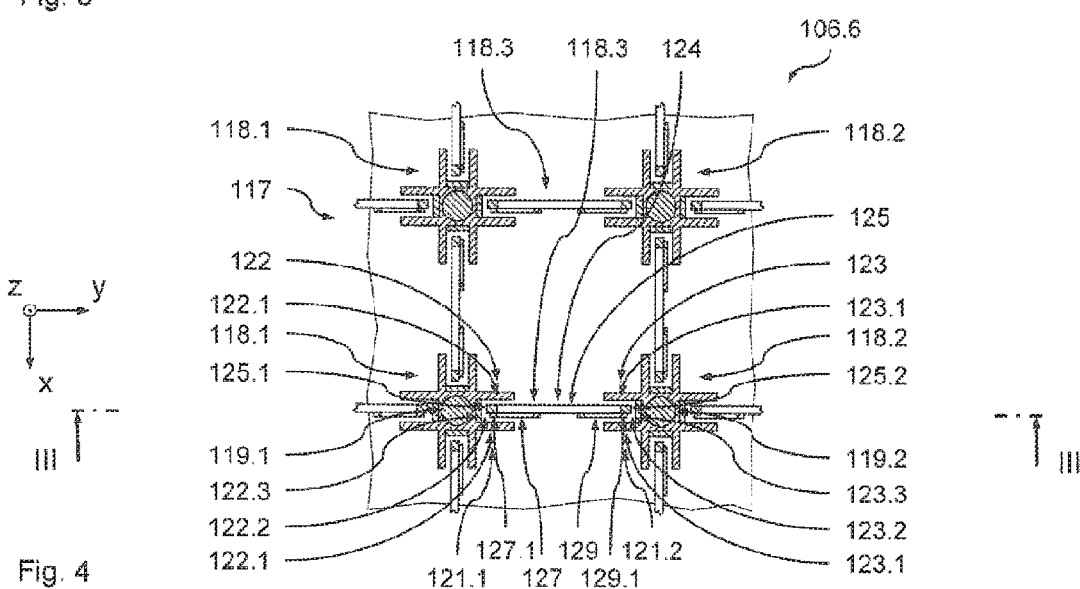
FIG. 4 is a schematic sectional representation of a part of the optical module of FIG. 2 (along line IV-IV of FIG. 3)

As can be seen from FIGS. 2 to 4, in the present example, the first and second force generating units 120.1 and 120.2 are configured to operate in the manner of a contactless force actuator, more precisely, a Lorentz actuator. Such a contactless working principle greatly simplifies manufacture of the deformation device 118. Furthermore, it avoids the introduction of parasitic forces and/or moments into mirror 111 via the support of the deformation device 118.

In the present example, the first force generating unit 120.1 includes a passive first magnet device 121.1 of the first deformation unit 118.1, while the second force generating unit 120.2 includes a passive second magnet device 121.2 of the second deformation unit 118.2. The third deformation unit includes an active electric coil device 121.3 spatially and functionally associated the first and second magnet device 121.1, 121.2, respectively.

Hence, no energy supply is involved to the first and second deformation unit 118.1 and 118.2. This has the great advantage that the immediate introduction of parasitic forces and/or moments into mirror 111 via energy supply lines, such as cables etc., may effectively be avoided. Furthermore, since the electric coil device 121.3, as the only active component of the respective deformation device 118, is supported in a manner mechanically decoupled from mirror 111, cooling of this active component this greatly simplified. This is due to the fact that no immediate introduction of parasitic forces and/or moments into mirror 111 via components of the cooling device (such as cooling medium ducts etc.) may occur.

As can be seen, in particular, from FIGS. 3 and 4, the first magnet device 121.1 is designed as a passive magnetic yoke component having a generally U-shaped first magnetic yoke part 122 having two first shank elements 122.1 generating a first magnetic field MF1 within an interstice 122.2 defined between the first shank elements 122.1. In the present example, the first magnetic field is substantially perpendicular to an interstice plane of main extension (parallel to the drawing plane of FIG. 3 and the yz plane, respectively) of the first interstice 122.2. The first magnetic field MF1 is generated by a suitably magnetized base part 122.3 of the first magnetic yoke part 122

Similarly, the second magnet device 121.2 is designed as a passive magnetic yoke component having a generally U-shaped second magnetic yoke part 123 having two second shank elements 123.1 generating a second magnetic field MF2 within an interstice 123.2 defined between the first shank elements 123.1. In the present example, the second magnetic field is substantially perpendicular to an interstice plane of main extension (parallel to the drawing plane of FIG. 3 and the yz plane, respectively) of the second interstice 122.2. The second magnetic field MF2 is generated by a suitably magnetized base part 123.3 of the second magnetic yoke part 123.

The electric coil device 121.3, in the present example, has a main electric coil unit 124 including a main electric coil element 125 of generally rectangular shape and generally flat design to achieve, in particular, a very compact and space-saving configuration. The main electric coil element 125 defines a main coil plane of main extension (parallel to the drawing plane of FIG. 3 and the yz plane, respectively). The main electric coil element 125 has a first main coil section 125.1 and a second main coil section 125.2 located opposite to the first main coil section 125.1 within the main coil plane of main extension.

The first main coil section 125.1 is spatially and functionally associated to the first magnetic yoke part 122 in that it extends throughout the interstice 122.2 defined between the first shank elements 122.1. Hence, the first deformation force F1, in response to the presence of the first magnetic field MF1, is generated when an electric current EC is applied to the main electric coil element 125 (as a control signal). The magnitude of the first deformation force F1 assumes a maximum value (as a function of the current EC applied), since the first main coil section 125.1, in a direction perpendicular to the first deformation force F1 and the first magnetic field MF1 (and in the circumferential direction of a central part of the first main coil section 125.1 of the main electric coil element 125) extends throughout the first interstice 122.2.

Similarly, the second main coil section 125.2 is spatially and functionally associated to the second magnetic yoke part 123 in that it extends throughout the interstice 123.2 defined between the second shank elements 123.1. Hence, the second deformation force F2, in response to the presence of the second magnetic field MF2, is generated when an electric current EC is applied to the main electric coil element 125. The magnitude of the second deformation force F2 assumes a maximum value (as a function of the current EC applied as the common control signal), since the second main coil section 125.2, in a direction perpendicular to the second deformation force F2 and the second magnetic field MF2 (and in the circumferential direction of a central part of the second main coil section 125.2 of the main electric coil element 125) extends throughout the second interstice 123.2.

As can be seen, in particular, from FIG. 3, the adjacent lever elements 119.1 and 119.2 (carrying the first and second magnetic yoke part 122 and 123, respectively) radially protrude from mirror 111, the radial direction being defined by the local curvature of the optical surface 111.1 of mirror 111. More precisely, the adjacent lever elements 119.1 and 119.2 define longitudinal lever axes 119.3 and 119.4, respectively. The first lever element longitudinal axis 119.3 intersects the optical surface 111.1 at a first point of intersection and forms the first surface normal of the optical surface 111.1 at the first point of intersection. Similarly, the second lever element longitudinal axis 119.4 intersects the optical surface 111.1 at a second point of intersection and forms the second surface normal of the optical surface 111.1 at this second point of intersection.

In the present example, the first lever element longitudinal axis 119.3 and the second lever element longitudinal axis 119.4 define a lever element angle LEA and a bisecting line 118.5 (defining a bisecting line angle BLA, which is half the lever element angle LEA, i.e. BLA=0.5·LEA applies).

In the present example, in order to generate the collinearity of the first deformation force F1 and the second deformation force F2, the first magnetic yoke part 122 and the second magnetic yoke part 123 are arranged to be mirror symmetric to the bisecting line 118.5. Furthermore, in order to generate the collinearity of the first deformation force F1 and the second deformation force F2, the first main coil section 125.1 and the second main coil section 125.2 are also arranged to be mirror symmetric to the bisecting line 118.5.

Finally, in order to generate the collinearity of the first deformation force F1 and the second deformation force F2, the first main coil section 125.1 and the second main coil section 125.2 are also arranged such that the first deformation force F1 and the second deformation force F2, in the first operating state as shown in FIG. 3, are substantially perpendicular to the bisecting line 118.5.

In the present example, this is achieved by the first main coil section 125.1 and the second main coil section 125.2 being parallel to the bisecting line. It will be appreciated however that, with other embodiments of the disclosure, another (arbitrarily shaped) design of first main coil section 125.1 and the second main coil section 125.2 may be chosen as long as the resultant first deformation force F1 and the resultant second deformation force F2, in the first operating state, are substantially perpendicular to the bisecting line 118.5.

More precisely, to achieve collinearity of the first deformation force F1 and the second deformation force F2, the first main coil section 125.1 and the second main coil section 125.2, are substantially symmetric to a first plane of symmetry substantially perpendicular to the first deformation force F1 (here, a plane containing bisecting line 118.5). Furthermore, each of the first main coil section 125.1 and the second main coil section 125.2 is substantially symmetric to a second plane of symmetry substantially perpendicular to the first plane of symmetry and substantially parallel to the first magnetic field MF1 of the first magnetic yoke part 122 and the second magnetic field MF2 of the second magnetic yoke part 123 (here, a plane containing the first deformation force F1 and perpendicular to bisecting line 118.5).

It will be appreciated that, under ideal conditions where (in the sectional plane shown in FIG. 3) the electrical properties of the first and second main coil section 125.1 and 125.2 are mirror symmetric with respect to the bisecting line 118.5 and the magnetic properties of the first and second magnetic yoke part 122 and 123 of mirror symmetric with respect to the bisecting line 118.5, the first and second deformation force F1 and F2 cancel out each other.

Under non-ideal conditions, however, certain deviations may exist between these electrical properties and/or the magnetic properties of the two force generating units 120.1 and 120.2. Hence, in order to be able to compensate such non-ideal deviations, in the present example, calibration and/or trimming components are provided at the level of the interaction (or the operational interface, respectively) between the electric coil device 124 and the first magnet device 121.1 and/or the second magnet device 121.2, respectively, as will be explained in greater detail below.

More precisely, in the present example, the electric coil device 121.3 includes a force level trimming electric coil unit 126 configured to cooperate with the first magnet device 121.1 to adjust a force level of one of the first deformation force F1. In the present example, the force level trimming electric coil unit is formed by a fourth level trimming electric coil element 126 that is configured to substantially equalize the first deformation force F1 and the second deformation force F2 generated when the electric current EC is applied to the main electric coil element 125. Such a configuration, in particular, allows realizing a simple open loop control of the deformation. It will be appreciated however that, with other embodiments of the disclosure, the force level trimming electric coil element 127 may be separately energized by the control unit 109.

The force level trimming electric coil unit 126 includes a force level trimming electric coil element 127 located immediately adjacent to the main electric coil element 125 and defining a force level trimming coil plane of main extension which is substantially parallel to the main coil plane of main extension. The force level trimming electric coil element 127 has a force level trimming coil section 127.1 spatially associated, namely located adjacent, to the first main coil section 125.1.

In the present example, the force level trimming coil section 127.1 is substantially parallel to the first main coil section 125.1 and, as the first main coil section 125.1, extends throughout the interstice 122.2. It will be appreciated however that, with other embodiments of the disclosure, any other configuration may be chosen for the force level trimming coil section 127.1 as long as the collinearity of the first and second deformation force F1 and F2 is maintained.

The force level trimming electric coil element 127 is configured to compensate an effect of a difference between the first magnetic field MF1 and the second magnetic field MF2 on the generation of the first deformation force F1 and the second deformation force F2 when the electric current EC is applied to the main electric coil element 125. By this approach, in a very simple manner, deformation force level trimming and calibration, respectively, may be achieved, in particular, despite potential differences in the magnetic properties of the two magnet devices 121.1 and 121.2, respectively.

Furthermore, in the present example, the electric coil device also includes a force direction trimming electric coil unit 128 configured to cooperate with the second magnet device 121.2 to adjust a direction of the second deformation force F2 generated when the electric current EC is applied to the main electric coil unit 125. By this approach, in a very simple way, the net resultant force FR on mirror 111 may be adjusted and/or calibrated (e.g. to be substantially zero or to be non-zero in one or more defined operating states).

The force direction trimming electric coil unit 128 includes a force direction trimming electric coil element 129 located immediately adjacent to the main electric coil element 125 and defining a force direction trimming coil plane of main extension which is substantially parallel to the main coil plane of main extension. The force direction trimming electric coil element 129 has a force direction trimming coil section 129.1 spatially associated, namely located adjacent, to the second main coil section 125.2.

In the present example, the force direction trimming coil section 129.1 is substantially parallel to the second main coil section 125.2 and, other than the second main coil section 125.2, doesn't extend throughout the interstice 123.2 but only through an upper part of the interstice 123.2. In the present example, the force direction trimming coil section, in a trimming coil extension direction perpendicular to the second deformation force F2 and the second magnetic field MF2, only extends over a fraction of a dimension of the interstice 123.2 in the trimming coil extension direction which is about 20% of a dimension of the interstice 123.2 in the trimming coil extension direction. It will be appreciated that, with other embodiments, another fraction may be chosen. Preferably, the fraction, in particular being up to 95%, preferably up to 50%, more preferably 30% to 50%. By this approach, the direction of the second deformation force F2 (resulting from the electric current EC applied to the main coil element 125 and an, eventually different, electric current ECC applied to the force direction trimming coil element 129) may be adjusted or calibrated, respectively.

The force direction trimming electric coil element 129, in the present example, is configured to compensate an effect of a difference between the two force generating units 120.1 and 120.2 regarding the direction of the first and second deformation force F1 and F2 when the electric current EC is applied to the main electric coil element 125. By this approach, in a very simple manner, deformation force direction trimming and calibration, respectively, may be achieved, in particular, despite potential differences in the magnetic properties of the two force generating units 120.1 and 120.2, respectively. It will be appreciated however that, with other embodiments of the disclosure, any other configuration may be chosen for the force direction trimming coil section 129.1 as long as the desired orientation of the first and second deformation force F1 and F2 is maintained.

It will be appreciated that, here as well, the force direction trimming electric coil element 129 may electrically connected to the main electric coil element 125, such that the electric current EC is applied to, both, the main electric coil element 125 and the force direction trimming electric coil element 129 (as a single common control signal). This may be done, for example, to generate collinearity of the first and second deformation force F1 and F2.

It will be appreciated however that, with certain embodiments of the disclosure, the force direction trimming electric coil element 129 may be selectively electrically connectable (by the control unit 109) to the main electric coil element 125, such that, in a second operating state, a non-zero net resultant force FR is generated (due to non-parallel first and second deformation forces F1 and F2). It will be further appreciated that, in both of these variants, the force direction trimming electric coil element 129 may be separately energized by the control unit 109.

It will be appreciated that force level and/or direction trimming may be implemented using force sensors or the like located at the support structure 118.4 and associated to the respective deformation device 118. It will be further appreciated that, with other embodiments of the disclosure, force level trimming and force direction trimming may be integrated into one single trimming electric coil element. Moreover, with other embodiments of the disclosure, force level trimming and/or force direction trimming may implemented within both force generating units 120.1 and 120.2.

It will be further appreciated that the part of either of the electric coil elements 125, 127 and 129 not immediately cooperating with the associated magnet device 121.1 and 121.2, respectively, should preferably be kept as small as functionally possible to at least largely avoid waste of energy and generation of more heat than functionally necessary, respectively.

In the present example, for instance, the length of the part of the force level trimming coil 127 continuing the force level trimming coil section 127.1 and protruding beyond the interstice 122.2 is preferably less than 20% of the length of the force level trimming coil section 127.1 extending within the interstice 122.2.

As mentioned above, the deformation control by control unit 109, after calibration, can simply be implemented as an open loop control by passing a predefined electric current EC to the electric coil device 121.3 without any position or deformation sensing. This not only greatly reduces cost, but also allows very fast deformation generation, as transconductance amplifiers can be configured to operate at very high bandwidth (well above 100 kHz).

As had already been outlined above, in the present example, the first force generating unit 120.1 is arranged such that the first deformation force F1 exerted on the first lever element 119.1, introduces a first bending moment BM1 into the associated first part of mirror 111, the first bending moment BM1 generating a definable first deformation of the associated first optical surface section of the optical surface 111.1. In addition, similarly, the second force generating unit 120.2 is arranged such that the second deformation force F2 exerted on the second lever element 118.2, introduces a second bending moment BM2 (in the first operating state balancing the first bending moment BM1) into the associated second part of mirror 111, the second bending moment BM2 generating a definable second deformation of a second optical surface section of the optical surface 111.1. Hence, in particular in the first operating state with mutually canceling bending moments BM1 and BM2 beneficially smooth deformation patterns at the level of the optical surface 111.1 are achieved.

As can be seen, in particular from FIG. 3, in the present example both the first lever element 119.1 and the second lever element 119.2 are connected to mirror 111 via a ball and socket type joint as will be explained by way of example in greater detail now with reference to the first lever element 119.1.

As can be seen from FIG. 3, to this end, the first lever element 119.1 has a spherical end section 119.5 engaging a mating spherical recess 111.2 on the rear side of mirror 111. By this approach, a very simple and efficient way of introducing the first bending moment BM1 from the first lever element 119.1 into the associated part of mirror 111 is achieved. In particular, by this approach, a connection at the ball and socket type interface is achieved in which the deformation load is transmitted in a manner adapted to the strength of the connection.

More precisely, by this approach, in the present example, the first lever element 119.1 is connected to mirror 111 via an interface configured to substantially completely transmit the bending moment BM1 introduced into the first lever element 119.1 (by the first deformation force F1 exerted on the first lever element 119.1) via a shear stress at the ball and socket type interface. This has the great advantage that the load to be transmitted over the ball and socket type interface is substantially evenly distributed over the entire surface of the ball and socket type interface, thereby greatly reducing the risk of failure of the connection. In other words, the effort involved for obtaining a sufficiently long-term stable connection at the ball and socket type interface is greatly reduced.

In particular, this applies to connections where a bonding material (such as an adhesive, a solder or the like) is used for establishing the mechanical connection between the first lever element 119.1 and the mirror 111 at the ball and socket type interface.

The above applies, however, also to connections where no such bonding material is used for establishing the mechanical connection, as it is the case in the present example, where a frit bonding technique is used for connecting the first lever element 119.1 and the mirror 111 at the ball and socket type interface.

It will be appreciated that, with other embodiments, the connection between the respective lever element 119.1 and 119.2 and mirror 111 may be achieved in any other desired and suitable way. Preferably, at least one of the first lever element 119.1 and the second lever element 119.2 is connected to mirror 111 using at least one of an adhesive bonding technique, a frit bonding technique, an anodic bonding technique, an optical contacting technique, a soldering technique and, in particular, a laser soldering technique.

It will be appreciated that, as outlined above, depending on the desired properties of the optical imaging process, basically, one single deformation device 118 as outlined above may be sufficient to achieve the desired deformation of the optical surface 111. Preferably, the deformation arrangement includes a plurality of such deformation devices configured to introduce a definable deformation into the optical surface 111. Basically, the deformation devices 118 may be distributed in any suitable way over mirror 111 as a function of the deformation of the optical surface 111.1 to be obtained during operation of the optical module 106.6. Preferably, the deformation devices 118 are substantially evenly distributed over a deformation target area of mirror 111 to be deformed during operation of mirror 111, since such a configuration typically allows achieving particularly beneficial deformation patterns of the optical surface 111.1.

In the present example, the deformation devices 118 are arranged in the manner of a Cartesian grid array. With other embodiments, however, the deformation devices 118 may be arranged at least section wise in the manner of a triangular grid array and/or at least section wise in the manner of a honeycomb grid array. Here again it will be appreciated that the arrangement preferably is selected as a function of the deformation of the optical surface 111.1 to be obtained during operation of the optical module 106.6.

As can be seen, in particular from FIG. 4, in the present example, each inner lever element 119.1, 119.2 (not located at immediately at the outer circumference of the deformation target area of mirror 111) is connected as a shared deformation component to four deformation devices 118. By this approach, higher-order deformation of the optical surface 111.1 may be obtained in a simple manner.

As already outlined above, the third deformation units 118.3 are supported in a manner mechanically and thermally decoupled from mirror 111. While mechanical decoupling in a beneficial manner avoids the introduction of parasitic forces and/or moments into the optical element, thermal decoupling reduces the efforts involved for any temperature control of mirror 111.

In the present example, the third deformation units 118.3 are supported by a support structure 118.4 supported in an isostatic manner on the projection optics box 102.1 and in a manner mechanically decoupled from mirror 111. Hence, mirror 111 is be supported by a first support structure formed by holding ring 115, while the third deformation units 118.3 are supported by a second support structure formed by support structure 118.4. The first support structure 115 is separate from the second support structure 118.4, both being supported (partly in an isostatic manner) on a third support structure formed by the projection optics box 102.1 to achieve particularly simple mechanical and thermal decoupling.

With certain other embodiments of the disclosure, however, a different support structure may be selected. For example, a passive support concept may be selected for mirror 111, where mirror 111 is kinematically mounted to holding ring 115 (e.g. via a passive hexapod structure similar to support 116.1 as it is indicated by the dashed contour 130.1 in FIG. 2), while holding ring 115, in turn, is supported in an actively adjustable manner via support units (similar to units 112) to the housing structure 102.1. In this case, the support structure 118.4 is preferably supported in a vibration isolated manner on the projection optics box 102.1 to achieve mechanical and thermal decoupling.

With certain other embodiments of the disclosure, however, a further different support concept may be selected. For example, a passive support concept may be selected for mirror 111, where mirror 111 is kinematically mounted to holding ring 115 (e.g. via a passive hexapod structure similar to support 116.1 as it is indicated by the dashed contour 130.1 in FIG. 2), while holding ring 115, in turn, again is supported in a vibration isolated manner via support units 116.1 to the housing structure 102.1. In this case, the support structure 118.4 may again be supported in a kinematic or isostatic manner, respectively, on the projection optics box 102.1, e.g. via support elements 116.2.

In a variant of this support scenario, the support structure 118.4 might even be supported in on the holding ring 115 as it is indicated in FIG. 2 by the dashed contour 130.2. The support elements 103.2 could be a simple kinematic mount (e.g. similar to the hexapod structure formed by elements 116.2). Preferably, however, support elements 103.2, in such a scenario, form a vibration isolated support, preferably having a vibration isolation frequency (or resonant frequency) below 5 Hz.

The image of the pattern formed on the mask 103.1 is usually reduced in size and transferred to several target areas of the substrate 104.1. The image of the pattern formed on the mask 103.1 may be transferred to the respective target area on the substrate 104.1 in two different ways depending on the design of the optical exposure apparatus 101. If the optical exposure apparatus 101 is designed as a so called wafer stepper apparatus, the entire image of the pattern is transferred to the respective target area on the substrate 104.1 in one single step by irradiating the entire pattern formed on the mask 103.1. If the optical exposure apparatus 101 is designed as a so called step-and-scan apparatus, the image of the pattern is transferred to the respective target area on the substrate 104.1 by progressively scanning the mask table 103.2 and thus the pattern formed on the mask 103.1 under the projection beam while performing a corresponding scanning movement of the substrate table 104.2 and, thus, of the substrate 104.1 at the same time.

In both cases, a given spatial relationship between the optical components participating in the exposure process (i.e. between the optical elements of the optical element unit group 106, i.e. the mirrors of the optical element modules 106.1 to 106.6, with respect to each other as well as with respect to the mask 103.1 and with respect to the substrate 104.1) has to be maintained within predetermined limits to obtain a high quality imaging result.

During operation of the optical exposure apparatus 101, the relative position of the mirrors of the optical element modules 106.1 to 106.6 with respect to each other as well as with respect to the mask 103.1 and the substrate 104.1 is subject to alterations resulting from, both, intrinsic and extrinsic disturbances introduced into the system. Such disturbances may be mechanical disturbances, e.g. in the form vibrations resulting from forces generated within the system itself but also introduced via the surroundings of the system, e.g. the base structure 107 (which itself may formed by a ground structure or be supported on a ground structure). They may also thermally induced disturbances, e.g. position alterations due to thermal expansion of the parts of the system.

In order to keep the above predetermined limits of the spatial relation of the mirrors of the optical element modules 106.1 to 106.6 with respect to each other as well as with respect to the mask 103.1 and the substrate 104.1, each one of the optical element modules 106.1 to 106.6 is actively positioned in space via their support devices 108.1 to 108.6, respectively. Similarly, the mask table 103.2 and the substrate table 104.2 are actively positioned and/or oriented in space via the respective support devices 103.3 and 104.3, respectively.

Furthermore, during operation of the optical exposure apparatus 101, the optical surface 111.1 of mirror 111 is deformed in the manner as it has been outlined above in order to correct further wavefront aberrations.

Figure 5:
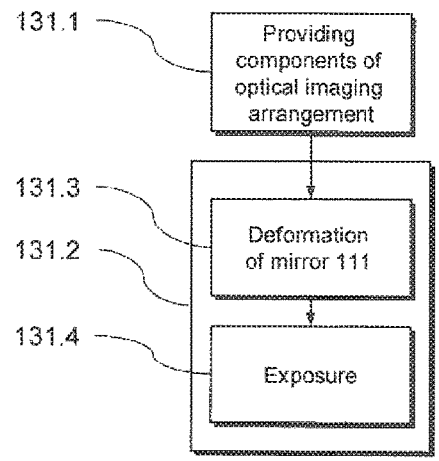
FIG. 5 is a block diagram of a preferred embodiment of an optical imaging method according to the disclosure including a preferred embodiment of a method of deforming an optical element according to the disclosure which may be executed with the optical imaging arrangement of FIG. 1.
Figure 7:
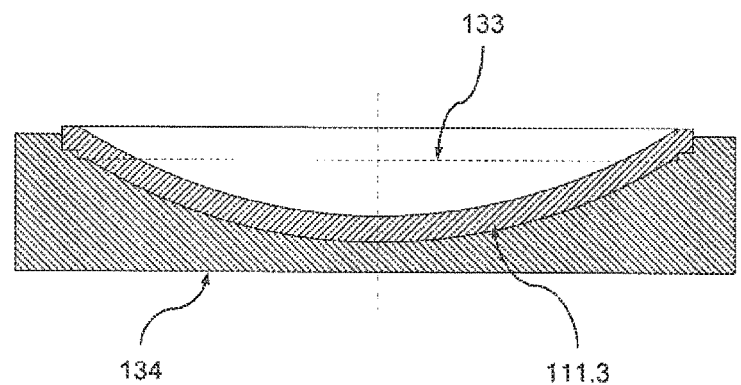
FIG. 7 is a schematic representation of a part of the optical element of FIG. 2 in a first manufacturing state.
Figure 8:
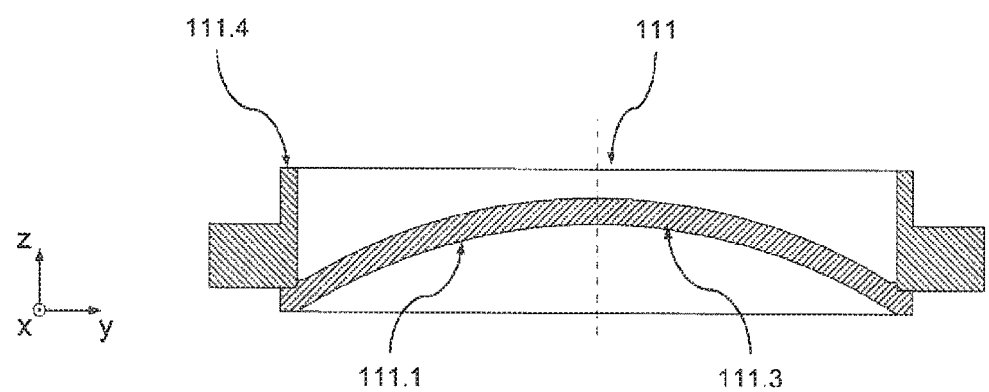
FIG. 8 is a schematic representation of a part of the optical element of FIG. 2 in a second manufacturing state.
Figure 9:
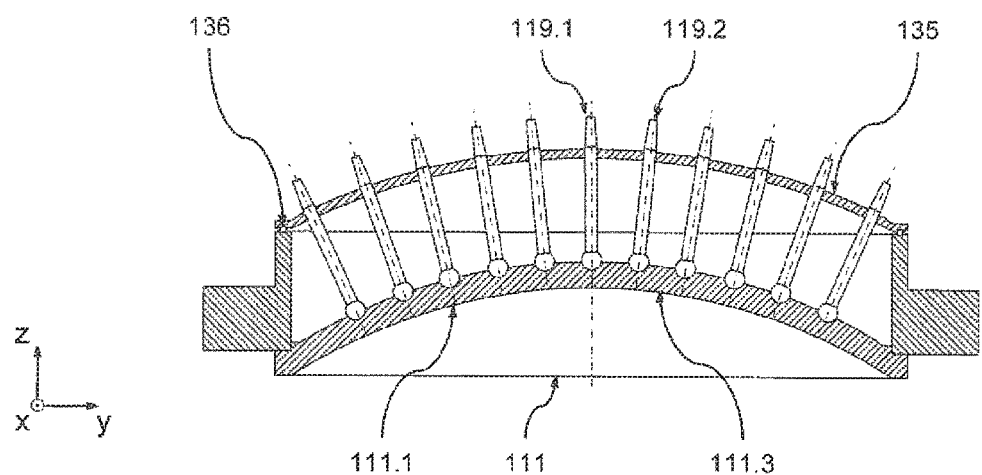
FIG. 9 is a schematic representation of a part of the optical element of FIG. 2 in a third manufacturing state.

Hence, as can be seen from FIG. 7, in the present example, with the exposure apparatus 101 an optical imaging method according to the disclosure may be executed. As depicted in FIG. 5, the method starts in a step 131.1, wherein the components of the optical imaging apparatus 101 are provided as outlined above. In a step 131.2, the image of the pattern formed on the mask onto a substrate using the optical element modules 106.1 to 106.6 is executed. Prior to actual exposure in an exposure step 131.4, in at least one deformation step 131.3, mirror 111 of the optical element module 106.6 is deformed in a defined manner as it has been outlined above using a method of deforming an optical element according to the disclosure.

It will be appreciated that the deformation step 131.2 may ensue at least partially in sequence and/or contemporaneously with the adjustment of the position and/or orientation of the components participating in the imaging process as it has been outlined above. Furthermore, it will be appreciated that the deformation step 131.2 may ensue prior to age exposure step 131.4. With other embodiments, however, the deformation step 131.2 may only ensue from time to time, e.g. prior to each x-th exposure step 131.4 or after a certain amount of time elapsed since the last deformation step.

It will be appreciated that the components as described above may be made of any desired and suitable material for performing the function as outlined. Preferably, at least one of mirror 111 and lever element 119.1, 119.2 connected to the mirror 111 includes a material selected from a material group consisting of Zerodur, Ultra Low Expansion glass (ULE), Cordierite and quartz. In particular materials having a low coefficient of thermal expansion are highly preferred in this respect.

As can be seen from FIG. 2, mirror 111 includes a main body element 111.3 forming the optical surface 111.1. The main body element 111.3, in the present example, is a generally thin walled shell element. Furthermore, mirror 111 includes a generally ring shaped outer stabilizing element 111.4 connected to the main body element 111.3 at the outer circumference thereof and forming the support interface for the support units 112. Such a configuration allows simple and economic manufacture of the mirror as will be explained in greater detail below.

In the present example, the outer stabilizing element 111.4 is connected to the main body element 111.3 using an adhesive bonding technique. With other embodiments of the disclosure any other desired bonding technique may be used. In particular, at least one of an adhesive bonding technique, a frit bonding technique, an anodic bonding technique, an optical contacting technique, a soldering technique and, in particular, a laser soldering technique.

It will be appreciated that, basically, any desired and suitable material may be used for the main body element 111.3 and the outer stabilizing element 111.4, respectively. In the present example, the main body element 111.3 is formed by a first material and the outer stabilizing element 111.4 is formed by a second material. The first and second materials have at least one material property, in particular, a coefficient of thermal expansion. In the present example, a grade of the material property, in a grading system defined by a field of use of the optical module 106.6, is lower in the second material than in the first material, in particular, lower by up to 1000%, preferably by up to 20%, more preferably by up to 2%, of the material property of the first material. In other words, preferably, the outer stabilizing element 111.4 is made of a lower grade material than the main body element 111.3 which, among others, yields more economic solutions.

In the present example, the second material has a deviation in the coefficient of thermal expansion (CTE) from the first material, i.e. a CTE mismatch, which is about 0.001 ppm/K. With certain other embodiments however, the deviation may range up to 0.01 ppm/K, even up to 1 ppm/K.

As will be explained in the following with reference to FIGS. 6 to 9, mirror 111 is manufactured according to a preferred embodiment of a method of manufacturing an optical element according to the disclosure.

Figure 6:
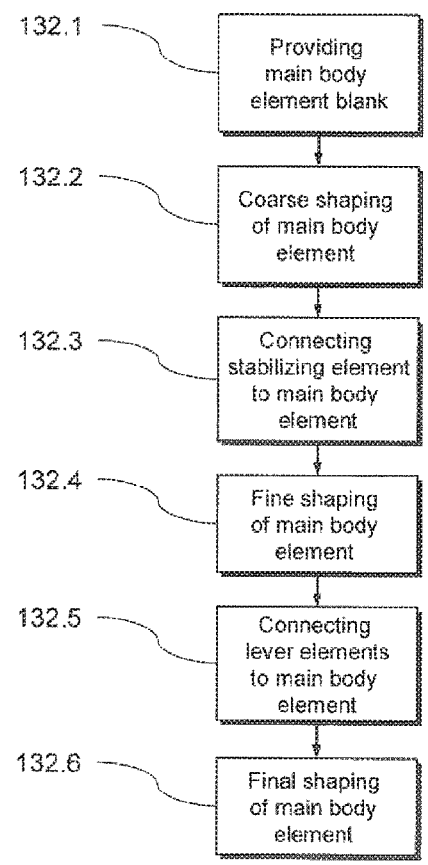
FIG. 6 is a block diagram of a preferred embodiment of a method of manufacturing an optical element according to the disclosure which may be used in the optical imaging arrangement of FIG. 1.

As can be seen from FIGS. 6 and 7, in a first step 132.1, the main body element 111.3 is provided. To this end, a generally plate shaped and thin walled blank element (as indicated by the dashed contour 133 in FIG. 7) is provided. Furthermore, in a coarse shaping step 132.2, blank element 133 is brought into a heated state and, in the heated state, introduced into a mold 134 to allow the blank element 133 to sag into the mold 134 (simply by gravity or eventually assisted by a corresponding pressure distribution) to shape the thin walled shell element yielding a coarse geometry of the main element body element 111.3.

In a further step 132.3, the outer stabilizing element 111.4 is connected to the main body element 111.3 as it has been described above and as it is shown in FIG. 8. Subsequently, in a fine shaping step 132.3, the main body element 111.3 is worked to obtain a near-final shape of the main body element 111.3, in particular, to obtain a final shape of the socket interfaces for lever elements 119.1, 119.2 as well as a near-final shape of the optical surface 111.1 of the main body element 111.3. Grinding and polishing of the relevant surfaces may, for example, ensue in this step. Such a variant allows highly economic manufacture of mirror 111. In particular, such a method allows manufacturing mirrors 111 of fairly complex geometry, in particular, with a comparatively strongly curved optical surface 111.1, without having to remove large volumes of material from a large material blank.

In a further step 132.5, the lever elements 119.1, 119.2 are connected to the main body element 111.3 as it has been described above and as it is shown in FIG. 9. To this end, in the present example, a template unit in the form of thin auxiliary plate element 135 is provided with fitted recesses to receive the free end of each of the lever elements 119.1, 119.2. This auxiliary plate element 135 is connected to the stabilizing element 111.4 in an isostatic manner (or kinematically, respectively), e.g. with three ball elements 136 in corresponding V-shaped grooves in the stabilizing element 111.4 and the auxiliary plate element 135.

Since the respective ball and socket interface at the spherical end 119.5 already constrains three degrees of freedom (namely translation in x, y, z), and the auxiliary plate element 135 plate constrains another two degrees of freedom (namely rotation about x, y), only rotation about z along the strut axis is not constraint. However, this is not necessary as there will be no disturbances in torsion along the axis during bonding, and the friction in the ball joint is sufficient to retain the strut in position in this particular rotational degree of freedom. Hence, in a very simple manner, highly precise manufacture of mirror 111 may be achieved.

It will be appreciated that this kinematic connection of the lever elements 119.1, 119.2 is of great importance to maintain accurate position and orientation of the lever elements 119.1, 119.2 as well as avoid excessive stress on the lever elements 119.1, 119.2 and hence potential fractural failure during the bonding process.

It will be appreciated that a terminal stress relieving step preferably forms part of either of the bonding processes as outlined above.

Finally, in a final shaping step 132.6, the main body element 111.3 is worked to obtain its final shape of the optical surface 111.1. Here, polishing of the relevant parts of the optical surface 111.1 may, for example, be used to polish out eventual deformations due to the lever bonding operation.

Although, in the foregoing, embodiments of the disclosure have been described where the optical elements are exclusively reflective elements, it will be appreciated that, with other embodiments of the disclosure, reflective, refractive or diffractive elements or any combinations thereof may be used for the optical elements of the optical element units.

Furthermore, it will be appreciated that the present disclosure, although mainly described in the context of microlithography in the foregoing, may also be used in the context of any other type of optical imaging process, typically involving a comparably high level of imaging accuracy. In particular, the disclosure may be used in the context of any other type of optical imaging process operating at different wavelengths.

What is claimed is:

1. An optical module, comprising:
an optical element; and
a deformation arrangement comprising a deformation device,
wherein:
the deformation arrangement is configured to introduce a definable deformation into an optical surface of the optical element;
the deformation device comprises first, second and third deformation units;
the first deformation unit is mechanically connected to a first part of the optical element and defines part of a first force generating unit configured to generate, as a function of a control signal, a definable first deformation force exerted on the first part of the optical element;
the second deformation unit is mechanically connected to a second part of the optical element and defines part of a second force generating unit configured to generate, as a function of the control signal, a definable second deformation force exerted on the second part of the optical element;
in an operating state, the first and second deformation forces at least substantially cancel out each other so that a net resultant force onto the optical element is at least substantially zero;
the third deformation unit is a shared force generating component shared between the first and second force generating units;
the first deformation unit cooperates with the third deformation unit to generate the first deformation force; and
the second deformation unit cooperates with the third deformation unit to generate the second deformation force.

2. The optical module according to claim 1, wherein:
the third deformation unit is an active component of at least one of the first force generating unit and the second force generating unit; and
at least one of the first deformation unit and the second deformation unit being a passive component.

3. The optical module according to claim 1, wherein at least one of the following holds:
at least one of the first force generating unit and the second force generating unit is configured to operate in the manner of a contactless actuator;
at least one of the first force generating unit and the second force generating unit is configured to operate in the manner of a Lorentz actuator; and
at least one of the first force generating unit and the second force generating unit is configured to operate in the manner of a force actuator.

4. The optical module according to claim 1, wherein
at least one of the first force generating unit and the second force generating unit comprises a magnet device and an electric coil device;
the third deformation unit comprises the electric coil device; and
at least one of the first deformation unit and the second deformation unit comprises the magnet device.

5. The optical module according to claim 4, wherein:
the electric coil device comprises a main electric coil unit configured to cooperate with a magnetic unit to generate at least one of the first deformation force and the second deformation force when an electric current is applied to the main electric coil unit; and
at least one of the following holds:
the electric coil device comprises a force level trimming electric coil unit configured to cooperate with the magnetic unit to adjust a force level of one of the first deformation force and the second deformation force; and the electric coil device comprises a force direction trimming electric coil unit configured to cooperate with the magnetic unit to adjust a direction of one of the first deformation force and the second deformation force generated when the electric current is applied to the main electric coil unit.

6. The optical module according to claim 5, wherein:
the main electric coil unit comprises a main electric coil element defining a main coil plane of main extension;
the main electric coil element has a first main coil section and a second main coil section located opposite to the first main coil section within the main coil plane of main extension;
the first main coil section is associated to a first magnetic unit of the first force generating unit to generate the first deformation force; and
the second main coil section is associated to a second magnetic unit of the second force generating unit to generate the second deformation force.

7. The optical module according to claim 6, wherein at least one of the following holds:
the main electric coil element is of generally flat design;
the main electric coil element is of generally rectangular shape;
the first and second main coil sections, to achieve collinearity of the first deformation force and the second deformation force in the at least one operating state, are substantially symmetric to a first plane of symmetry substantially perpendicular to the first deformation force, each of the first main coil section and the second main coil section further being substantially symmetric to a second plane of symmetry substantially perpendicular to the first plane of symmetry and substantially parallel to a first magnetic field of the first magnetic unit and a second magnetic field of the second magnetic unit;
at least one of the first magnetic unit and the second magnetic unit comprises a generally U-shaped magnetic yoke part comprising two shank elements to generate a magnetic field within an interstice defined between the shank elements;
the first magnetic unit comprises two magnetic first shank elements to generate a first magnetic field within a first interstice defined between the first shank elements, the first main coil section being located within the first interstice to generate the first deformation force when an electric current is applied to the main electric coil element, the first main coil section, in a direction perpendicular to the first deformation force and the first magnetic field extending throughout the first interstice;
the second magnetic unit comprises two magnetic second shank elements to generate a second magnetic field within a second interstice defined between the second shank elements, the second main coil section being located within the second interstice to generate the second deformation force when an electric current is applied to the main electric coil element, the second main coil section, in a direction perpendicular to the second deformation force and the second magnetic field extending throughout the second interstice;
the main electric coil element defines a circumferential direction, the first main coil section, in the circumferential direction, extending throughout an interstice defined between two shanks of a generally U-shaped part of the first magnetic unit; and
the main electric coil element defines a circumferential direction, the second main coil section, in the circumferential direction, extending throughout an interstice defined between two shanks of a generally U-shaped part of the second magnetic unit.

8. The optical module according to claim 6, wherein:
the force level trimming electric coil unit comprises a force level trimming electric coil element defining a force level trimming coil plane of main extension, the force level trimming coil plane of main extension being substantially parallel to the main coil plane of main extension;
the force level trimming electric coil element comprises a force level trimming coil section spatially associated to the first main coil section;
the first magnetic unit generates a first magnetic field in the area of the first main coil section, the second magnetic unit generating a second magnetic field in the area of the second main coil section;
the force level trimming electric coil element is configured to compensate an effect of a difference between the first magnetic field and the second magnetic field on the generation of the first deformation force and the second deformation force when the electric current is applied to the main electric coil element;
the force level trimming electric coil element is electrically connected to the main electric coil element, such that the electric current is applied to both, the main electric coil element and the force level trimming electric coil element, or the force level trimming electric coil element is electrically fed separately from the main electric coil element;
the first magnetic unit comprises two magnetic shank elements to generate the first magnetic field within an interstice defined between the shank elements, the first main coil section and the force level trimming coil section being located within the first interstice to generate the first deformation force when an electric current is applied to the main electric coil element, the first main coil section and the force level trimming coil section, in a direction perpendicular to the first deformation force and the first magnetic field extending throughout the first interstice.

9. The optical module according to claim 6, wherein:
the force direction trimming electric coil unit comprises a force direction trimming electric coil element defining a force direction trimming coil plane of main extension, the force direction trimming coil plane of main extension being substantially parallel to the main coil plane of main extension;
the force direction trimming electric coil element having a force direction trimming coil section spatially associated to a main coil section and a magnetic unit, the main coil section being one of the first main coil section and the second main coil section, the magnetic unit being one of the first magnetic unit main and the second magnetic unit;
the magnetic unit generating a magnetic field in the area of the main coil section;
the force direction trimming electric coil element is configured to adjust a direction of the deformation force generated by the associated main coil section when the electric current is applied to the main electric coil unit;
the force direction trimming electric coil element is selectively electrically connectable to the main electric coil element, such that the electric current is applied to, both, the main electric coil element and the force direction trimming electric coil element, or the force direction trimming electric coil element is electrically fed separately from the main electric coil element; and the magnetic unit comprises two magnetic shank elements generating the magnetic field within an interstice defined between the shank elements, the main coil section and the force direction trimming coil section being located within the interstice to generate the deformation force when an electric current is applied to the main electric coil element, the force direction trimming coil section, in a trimming coil extension direction perpendicular to the first deformation force and the first magnetic field extending only over a fraction of a dimension of the interstice in the trimming coil extension direction, the fraction being up to 95%.

10. The optical module according to claim 1, wherein at least one of the following holds:

the first force generating unit is arranged such that the first deformation force exerted on the first part of the optical element on a first lever element introduces a first bending moment into the first part of the optical element, the first bending moment generating a definable first deformation of a first optical surface section of the optical surface; and the second force generating unit is arranged such that the second deformation force exerted on the second part of the optical element on a second lever element introduces a second bending moment into the second part of the optical element, the second bending moment generating a definable second deformation of a second optical surface section of the optical surface.

11. The optical module according to claim 1, wherein at least one of the following holds:

the first force generating unit is connected to a first lever element located adjacent to a first optical surface area of the optical surface, the first lever element protruding, in a first surface normal direction from the optical element, the first surface normal direction being a first surface normal to the first optical surface area; and the second force generating unit is connected to a second lever element located adjacent to a second optical surface area of the optical surface, the second lever element protruding, in a second surface normal direction from the optical element, the second surface normal direction being a second surface normal to the second optical surface area.

12. The optical module according to claim 10, wherein:

the first lever element defines a first lever element longitudinal axis, the first lever element longitudinal axis intersecting the optical surface at a first point of intersection and forming the first surface normal at the first point of intersection;

the second lever element defines a second lever element longitudinal axis, the second lever element longitudinal axis intersecting the optical surface at a second point of intersection and forming the second surface normal at the second point of intersection;

the first lever element longitudinal axis and the second lever element longitudinal axis defining a lever element angle, the third deformation unit being arranged such that the first deformation force and the second deformation force, in at least one operating state, are substantially perpendicular to a bisecting line of the lever element angle;

at least one of the first lever element and the second lever element is connected to the optical element via a ball and socket type joint, the respective lever element having a spherical end section engaging a mating spherical recess within the optical element;

at least one of the first lever element and the second lever element is connected to the optical element via an interface configured to at least partially substantially completely, transmit a bending moment introduced into the lever element by the deformation force exerted on the lever element via a shear stress at the interface; and at least one of the first lever element and the second lever element is connected to the optical element using at least one of an adhesive bonding technique, a frit bonding technique, an anodic bonding technique, an optical contacting technique, and a soldering technique.

13. The optical module according to claim 1, wherein:

the deformation arrangement comprises a plurality of the deformation devices configured to introduce a definable deformation into the optical surface;

the deformation devices is substantially evenly distributed over a deformation target area of the optical element to be deformed during operation of the optical element;

the deformation devices at least section wise are arranged in the manner of an array in the manner of a Cartesian grid array and/or at least section wise in the manner of a triangular grid array and/or at least section wise in the manner of a honeycomb grid array; and each of at least two of the deformation devices are configured to exert a definable deformation force on the first part of the optical element sharing a component mechanically connected to the first part of the optical element to generate the definable deformation force.

14. The optical module according to claim 1, wherein at least one of the following holds:

the third deformation unit is supported in a manner mechanically decoupled from the optical element;

the third deformation unit is supported in a manner thermally decoupled from the optical element;

the optical element is supported by a first support structure and the third deformation unit is supported by a second support structure, the first support structure being separate from the second support structure, at least one of the first support structure and the second support structure being supported in an isostatic manner and/or in a vibration isolated manner on a third support structure; and the third deformation unit is supported by a first support structure, the first support structure being supported in an vibration isolated manner on the optical element.

15. The optical module according to claim 1, wherein at least one of the following holds:

at least one of the optical element and a lever element connected to the optical element comprises a material selected from a material group consisting of Zerodur, Ultra Low Expansion glass (ULE), Cordierite and quartz;

the optical element comprises a main body element forming the optical surface, the main body element, at least section wise, being at least one of a generally thin walled plate element and a generally thin walled shell element;

the optical element comprises a main body element defining an outer circumference, at least one outer stabilizing element being connected to the main body element at the outer circumference; and the optical element comprises a mirror.

16. The optical module according to claim 15, wherein at least one of the following holds:

the at least one outer stabilizing element is defined by a generally ring shaped element extending along the outer circumference;

the at least one outer stabilizing element is connected to the optical element using at least one of an adhesive bonding technique, a frit bonding technique, an anodic bonding technique, an optical contacting technique, a soldering technique;

the optical element is supported at the at least one outer stabilizing element;

the optical element supported at the at least one outer stabilizing element in a manner to be adjustable in at least one degree of freedom;

the main body element comprises a first material and the at least one outer stabilizing element comprises a second material, a property of the second material being less than a property of the first material, the property being selected from the group consisting of a coefficient of thermal expansion and a grade of the material property in a grading system defined by a field of use of the optical module; and the main body element comprises a first material and the at least one outer stabilizing element is formed by a second material, the second material having a deviation in a coefficient of thermal expansion from the first material, the deviation being up to 1 ppm/K.

17. An arrangement, comprising:
an illumination unit; and
a projection optical unit comprising an optical module according to claim 1,
wherein the illumination unit is configured to illuminate an object field of the projection optical unit, and the project optical unit is configured to project the object field of the projection optical unit into an image field of the projection optical unit.

18. A method of deforming an optical element using a deformation device which comprises first, second and third deformation units, the method comprising:
mechanically connecting the first deformation unit to a first part of the optical element,
mechanically connecting a second deformation unit to a second part of the optical element;
using the first deformation unit and the third deformation unit to exert, as a function of a control signal, a definable first deformation force on a first part of the optical element;
using the second deformation unit and the third deformation unit to exert as a function of the control signal, a definable second deformation force on a second part of the optical element,
wherein the first and second deformation forces generate a defined deformation of the optical element, and the first and second deformation forces at least substantially cancel out each other such that a net resultant force onto the optical element is at least substantially zero.

19. An optical module, comprising:
an optical element; and
a deformation arrangement comprising a deformation device,
wherein:
the deformation arrangement is configured to introduce a definable deformation into an optical surface of the optical element;
the deformation device comprises first, second and third deformation units;

the first deformation unit is mechanically connected to a first part of the optical element and defines part of a first force generating unit configured to generate, as a function of a control signal, a definable first deformation force exerted on the first part of the optical element;

the second deformation unit is mechanically connected to a second part of the optical element and defines part of a second force generating unit configured to generate as a function of the control signal, a definable second deformation force exerted on the second part of the optical element; and the third deformation unit is a shared force generating component shared between the first force generating unit and the second force generating unit;

the first deformation unit is configured to cooperate with the third deformation unit in a contactless manner to generate the first deformation force; and the second deformation unit is configured to cooperate with the third deformation unit in a contactless manner to generate the second deformation force.

20. An arrangement, comprising:
an illumination unit; and
a projection optical unit comprising an optical module according to claim 19,
wherein the illumination unit is configured to illuminate an object field of the projection optical unit, and the project optical unit is configured to project the object field of the projection optical unit into an image field of the projection optical unit.

21. A method of deforming an optical element using a deformation device which comprises first, second and third deformation units, the method comprising:
mechanically connecting the first deformation unit to a first part of the optical element,
mechanically connecting a second deformation unit to a second part of the optical element;
using the first deformation unit and the third deformation unit to exert, as a function of a control signal, a definable first deformation force on a first part of the optical element;
using the second deformation unit and the third deformation unit to exert as a function of the control signal, a definable second deformation force on a second part of the optical element;
exerting, as a function of a control signal, a definable first deformation force on a first part of the optical element via contactless cooperation of the first and third deformation units; and
exerting, as a function of the control signal, a definable second deformation force on a first part of the optical element via contactless cooperation of the second and third deformation units,
wherein the first deformation force and the second deformation force generate a defined deformation of the optical element.

22. The optical module of claim 1, wherein, in the operating state:
the first and second deformation forces are collinear;
the first force has a first value and a first direction; and
the second force has the first value and a second direction which is opposite the first direction.

23. The method of claim 18, wherein:
the first and second deformation forces are collinear;
the first force has a first value and a first direction; and the second force has the first value and a second direction which is opposite the first direction.

\* \* \* \* \*

UNITED STATES PATENT AND TRADEMARK OFFICE
CERTIFICATE OF CORRECTION

PATENT NO.         : 9,891,534 B2
APPLICATION NO.    : 15/280272
DATED              : February 13, 2018
INVENTOR(S)        : Yim-Bun Patrick Kwan It is certified that error appears in the above-identified patent and that said Letters Patent is hereby corrected as shown below:

Column 11, Line 53: Delete "the a" and insert -- the --, therefor.

Column 22, Line 15 (approx.): Delete "122" and insert -- 122. --, therefor.

Signed and Sealed this
First Day of May, 2018

Andrei Iancu
*Director of the United States Patent and Trademark Office*